(12) United States Patent
Gundel et al.

(10) Patent No.: US 11,988,703 B2
(45) Date of Patent: May 21, 2024

(54) MONITORING SYSTEM FOR EVALUATING A CONDITION OF AN ELECTRICAL GRID

(71) Applicants: 3M Innovative Properties Company, St. Paul, MN (US); Connected Intelligence Systems Ltd., Netanya (IL)

(72) Inventors: Douglas B. Gundel, Cedar Park, TX (US); Uri Bar-Ziv, Zichron Yaakov (IL); Eyal Doron, Caesarea (IL)

(73) Assignees: 3M Innovative Properties Company, St. Paul, MN (US); Connected Intelligence Systems Ltd., Netanya (IL)

( * ) Notice: Subject to any disclaimer, the term of this patent is extended or adjusted under 35 U.S.C. 154(b) by 184 days.

(21) Appl. No.: 17/757,428

(22) PCT Filed: Dec. 31, 2020

(86) PCT No.: PCT/US2020/067683
§ 371 (c)(1),
(2) Date: Jun. 15, 2022

(87) PCT Pub. No.: WO2021/138569
PCT Pub. Date: Jul. 8, 2021

(65) Prior Publication Data
US 2023/0324440 A1    Oct. 12, 2023

Related U.S. Application Data

(60) Provisional application No. 62/955,500, filed on Dec. 31, 2019.

(51) Int. Cl.
*G01R 31/12* (2020.01)
*G01R 15/16* (2006.01)
(Continued)

(52) U.S. Cl.
CPC ......... *G01R 31/1272* (2013.01); *G01R 15/16* (2013.01); *G01R 19/2513* (2013.01); *G01R 31/081* (2013.01); *G01R 31/085* (2013.01)

(58) Field of Classification Search
CPC ...... G01R 31/00; G01R 31/08; G01R 31/081; G01R 31/083; G01R 31/085; G01R 31/12;
(Continued)

(56) References Cited

U.S. PATENT DOCUMENTS 3,128,658 A    4/1964 Mitchell et al.
4,080,642 A  *  3/1978 Stolarczyk ............. H02H 1/003
                                                361/87

(Continued)

FOREIGN PATENT DOCUMENTS

CH          641278 A5    2/1984
CN         1161763 A    10/1997

(Continued)

OTHER PUBLICATIONS

International Preliminary Report on Patentability from International Application No. PCT/US2020/067683 dated Jul. 14, 2022, 9 pp.

(Continued)

*Primary Examiner* — Hoai-An D. Nguyen
(74) *Attorney, Agent, or Firm* — Shumaker & Sieffert, P.A.

(57) ABSTRACT

In general, a monitoring system includes one or more nodes that are capacitively coupled to a cable of a multiphase electric power line. In some examples, a node includes a coupling layer disposed over a jacket layer of the cable and capacitively coupled to a shield layer of the cable. In some examples, a node may include a first coupling layer capacitively coupled to a first cable, and a second coupling layer capacitively coupled to a second cable, such that the node is (Continued)

differentially coupled to the cable pair to generate a differential data signal and to perform at least one of: sensing a native signal within the cable pair; injecting an intentional signal into the cable pair; receiving an intentional signal from within the cable pair; or providing a channel characterization.

20 Claims, 32 Drawing Sheets

(51) Int. Cl.
*G01R 19/25* (2006.01)
*G01R 31/08* (2020.01)

(58) Field of Classification Search
CPC ............ G01R 31/1227; G01R 31/1263; G01R 31/1272; G01R 19/00; G01R 19/25; G01R 19/2513; G01R 15/00; G01R 15/14; G01R 15/146; G01R 15/148; G01R 15/16
USPC .................................................. 324/500, 509
See application file for complete search history.

(56) References Cited

U.S. PATENT DOCUMENTS

| | | | |
|---|---|---|---|
| 4,301,399 A | 11/1981 | Miller et al. | |
| 4,321,643 A | 3/1982 | Vernier | |
| 4,345,362 A | 8/1982 | de Givry | |
| 4,424,480 A | 1/1984 | Stefan | |
| 4,745,828 A | 5/1988 | Stepan | |
| 4,802,512 A | 2/1989 | Kodera | |
| 5,038,457 A | 8/1991 | Yasushi et al. | |
| 5,243,882 A | 9/1993 | Stepan | |
| 5,272,941 A | 12/1993 | English et al. | |
| 5,323,117 A | 6/1994 | Endoh et al. | |
| 5,502,374 A | 3/1996 | Cota | |
| 5,617,859 A | 4/1997 | Souza et al. | |
| 5,756,972 A | 5/1998 | Vranicar et al. | |
| 5,892,430 A | 4/1999 | Wiesman et al. | |
| 5,936,725 A | 8/1999 | Pike et al. | |
| 6,286,393 B1 | 9/2001 | Messer et al. | |
| 6,617,859 B1 | 9/2003 | Orton | |
| 6,633,166 B1* | 10/2003 | Kaiser ............ H02H 7/267 |
| | | | 702/65 |
| 6,734,662 B1 | 5/2004 | Fenske | |
| 7,166,804 B2 | 1/2007 | Yumura et al. | |
| 8,643,380 B1 | 2/2014 | Herbert | |
| 9,880,217 B1* | 1/2018 | Volkening ............ G01R 15/142 |
| 9,917,434 B2 | 3/2018 | George et al. | |
| 9,961,418 B2 | 5/2018 | Rodriguez et al. | |
| 10,192,678 B2 | 1/2019 | Koo et al. | |
| 10,338,103 B2 | 7/2019 | Gravermann et al. | |
| 2005/0050713 A1 | 3/2005 | Locher et al. | |
| 2005/0099636 A1 | 5/2005 | Schweser | |
| 2010/0114392 A1 | 5/2010 | Lancaster | |
| 2010/0308797 A1 | 12/2010 | Zimmermann | |
| 2012/0047724 A1 | 3/2012 | Yano et al. | |
| 2012/0192414 A1 | 8/2012 | Montena et al. | |
| 2012/0199392 A1 | 8/2012 | Samuelson et al. | |
| 2012/0203493 A1 | 8/2012 | Dobson et al. | |
| 2012/0268106 A1 | 10/2012 | Blake, Jr. et al. | |
| 2012/0306510 A1 | 12/2012 | White et al. | |
| 2013/0054162 A1 | 2/2013 | Smith et al. | |
| 2014/0354292 A1* | 12/2014 | Hiti ............ B60L 3/003 |
| | | | 324/503 |
| 2014/0368215 A1 | 12/2014 | Hoffman et al. | |
| 2015/0062328 A1 | 3/2015 | Lauffer et al. | |
| 2015/0089815 A1 | 4/2015 | Woodward | |
| 2015/0120218 A1 | 4/2015 | Garnacho Vecino et al. | |
| 2015/0128399 A1 | 5/2015 | Meierhans et al. | |
| 2015/0287180 A1 | 10/2015 | Frey | |
| 2016/0054363 A1 | 2/2016 | Rostron et al. | |
| 2016/0091533 A1 | 3/2016 | Soleillant et al. | |
| 2016/0139181 A1 | 5/2016 | Gravermann et al. | |
| 2016/0225248 A1 | 8/2016 | Rodriguez, Jr. et al. | |
| 2017/0222420 A1 | 8/2017 | Dhlamini | |
| 2017/0310092 A1 | 10/2017 | Viviroli | |
| 2017/0346265 A1 | 11/2017 | Soerensen | |
| 2018/0017611 A1 | 1/2018 | Radun et al. | |
| 2018/0059162 A1 | 3/2018 | LeBlanc et al. | |
| 2018/0062370 A1 | 3/2018 | Heidmann et al. | |
| 2018/0238955 A1 | 8/2018 | Bango et al. | |
| 2018/0252760 A1 | 9/2018 | Andle et al. | |
| 2018/0328531 A1 | 11/2018 | Weisenberg et al. | |
| 2019/0128927 A1 | 5/2019 | Shaw et al. | |
| 2019/0293706 A1 | 9/2019 | Sohn et al. | |
| 2019/0369152 A1 | 12/2019 | Fallet et al. | |
| 2019/0393685 A1 | 12/2019 | Sedlacek | |
| 2022/0260616 A1* | 8/2022 | Gundel ................ G01R 35/005 |

FOREIGN PATENT DOCUMENTS

| | | |
|---|---|---|
| CN | 1530965 A | 9/2004 |
| CN | 1601659 A | 3/2005 |
| CN | 101666849 A | 3/2010 |
| CN | 102116824 A | 7/2011 |
| CN | 102313861 A | 1/2012 |
| CN | 102623871 A | 8/2012 |
| CN | 202373838 U | 8/2012 |
| CN | 202978201 U | 6/2013 |
| CN | 103339813 A | 10/2013 |
| CN | 103560441 A | 2/2014 |
| CN | 104407270 A | 3/2015 |
| CN | 104518393 A | 4/2015 |
| CN | 204256093 U | 4/2015 |
| CN | 104821521 A | 8/2015 |
| CN | 104849628 A | 8/2015 |
| CN | 104979740 A | 10/2015 |
| CN | 105043457 A | 11/2015 |
| CN | 204988364 U | 1/2016 |
| CN | 205175574 U | 4/2016 |
| CN | 205263241 U | 5/2016 |
| CN | 105629136 A | 6/2016 |
| CN | 105699860 A | 6/2016 |
| CN | 205509462 U | 8/2016 |
| CN | 106124948 A | 11/2016 |
| CN | 205719288 U | 11/2016 |
| CN | 106353648 A | 1/2017 |
| CN | 106451253 A | 2/2017 |
| CN | 206038828 U | 3/2017 |
| CN | 206135313 U | 4/2017 |
| CN | 106646156 A | 5/2017 |
| CN | 106771933 A | 5/2017 |
| CN | 206147041 U | 5/2017 |
| CN | 106855443 A | 6/2017 |
| CN | 106950477 A | 7/2017 |
| CN | 106980075 A | 7/2017 |
| CN | 107306021 A | 10/2017 |
| CN | 206685810 U | 11/2017 |
| CN | 107453188 A | 12/2017 |
| CN | 108169644 A | 6/2018 |
| CN | 108376884 A | 8/2018 |
| CN | 207765893 U | 8/2018 |
| DE | 2928727 A1 | 2/1981 |
| DE | 3025819 A1 | 2/1982 |
| DE | 3702735 A1 | 8/1988 |
| DE | 20117063 U1 | 1/2002 |
| DE | 202008017358 U1 | 8/2009 |
| DE | 102011079935 A1 | 1/2013 |
| EP | 1902498 A1 | 3/2008 |
| EP | 2472688 A2 | 7/2012 |
| EP | 2579055 A1 | 4/2013 |
| EP | 2806277 A1 | 11/2014 |
| EP | 2818881 A1 | 12/2014 |
| EP | 3002594 A1 | 4/2016 |
| EP | 3109958 A1 | 12/2016 |
| EP | 3182428 A1 | 6/2017 |
| FR | 2282179 A1 | 3/1976 |
| FR | 2920922 A1 | 3/2009 |
| GB | 2288696 A | 10/1995 |
| GB | 2463689 A | 3/2010 |

(56) References Cited

FOREIGN PATENT DOCUMENTS

| | | |
|---|---|---|
| JP | S60256068 A | 12/1985 |
| JP | H03273809 A | 12/1991 |
| JP | H06160459 A | 6/1994 |
| JP | H06308191 A | 11/1994 |
| JP | H09182237 A | 7/1997 |
| JP | H10201070 A | 7/1998 |
| JP | 2004156910 A | 6/2004 |
| JP | 2015104274 A | 6/2015 |
| KR | 101317476 B1 | 10/2013 |
| KR | 101847456 B1 | 4/2018 |
| WO | 9840756 | 9/1998 |
| WO | 0042444 | 7/2000 |
| WO | 2006100590 A1 | 9/2006 |
| WO | 2007052095 A1 | 5/2007 |
| WO | 2008072226 A2 | 6/2008 |
| WO | 2012130816 A1 | 10/2012 |
| WO | 2014129817 A1 | 8/2014 |
| WO | 2015179102 A1 | 11/2015 |
| WO | 2016019666 A1 | 2/2016 |
| WO | 2016058721 A1 | 4/2016 |
| WO | 2016088174 A1 | 6/2016 |
| WO | 2016088175 A1 | 6/2016 |
| WO | 2016137424 A1 | 9/2016 |
| WO | 2016177571 A2 | 10/2016 |
| WO | 2016187090 A1 | 11/2016 |

OTHER PUBLICATIONS

Van Der Wielen, "Synchronization of online PD detection and localization setups using pulse injection", Proceedings of the 7th International Conference on Properties and Applications of Dielectric Materials, vol. 01, IEEE, Jun. 2003, pp. 327-330.

Wang et al., "Calibration of capacitive couplers for online PD detection in HV cables", IEEE Electrical Insulation Magazine, vol. 11, No. 03, IEEE, May 2005, pp. 28-39.

International Search Report and Written Opinion of International Application No. PCT/US2020/067683, dated Mar. 26, 2021, 46 pp.

\* cited by examiner

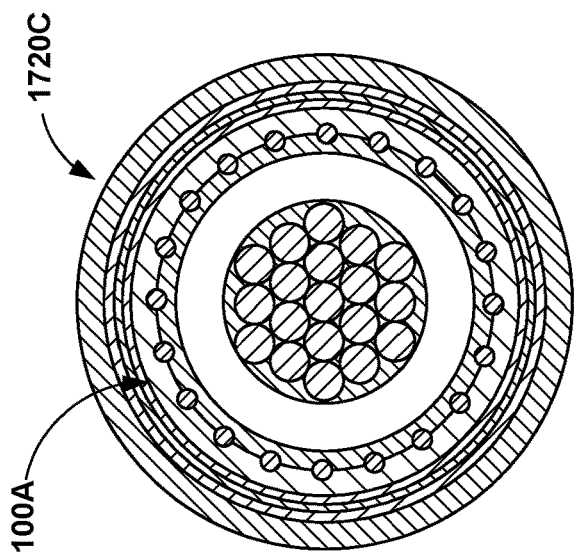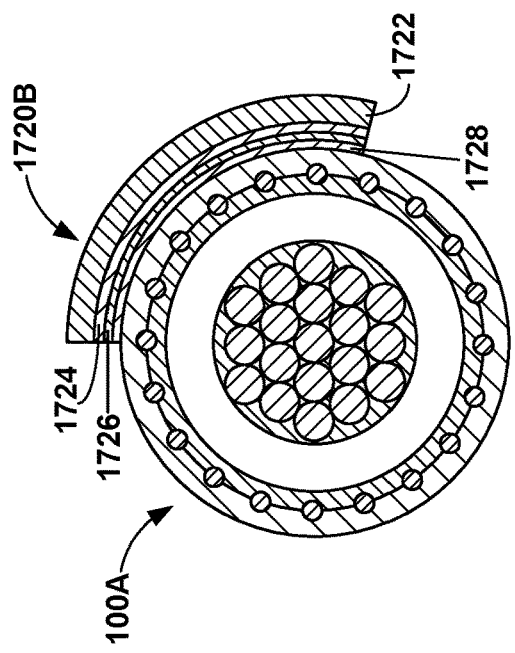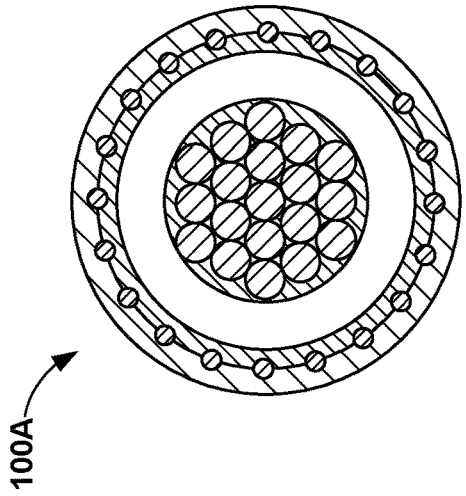

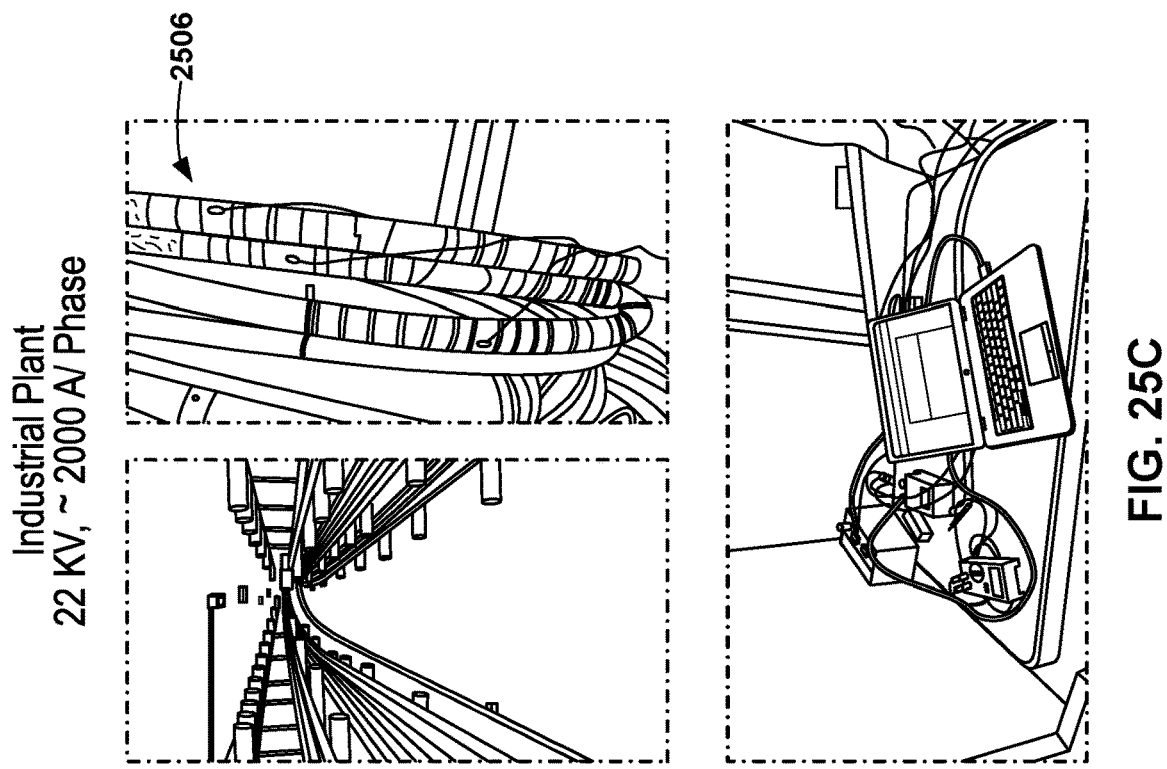
FIG. 25C
FIG. 25B
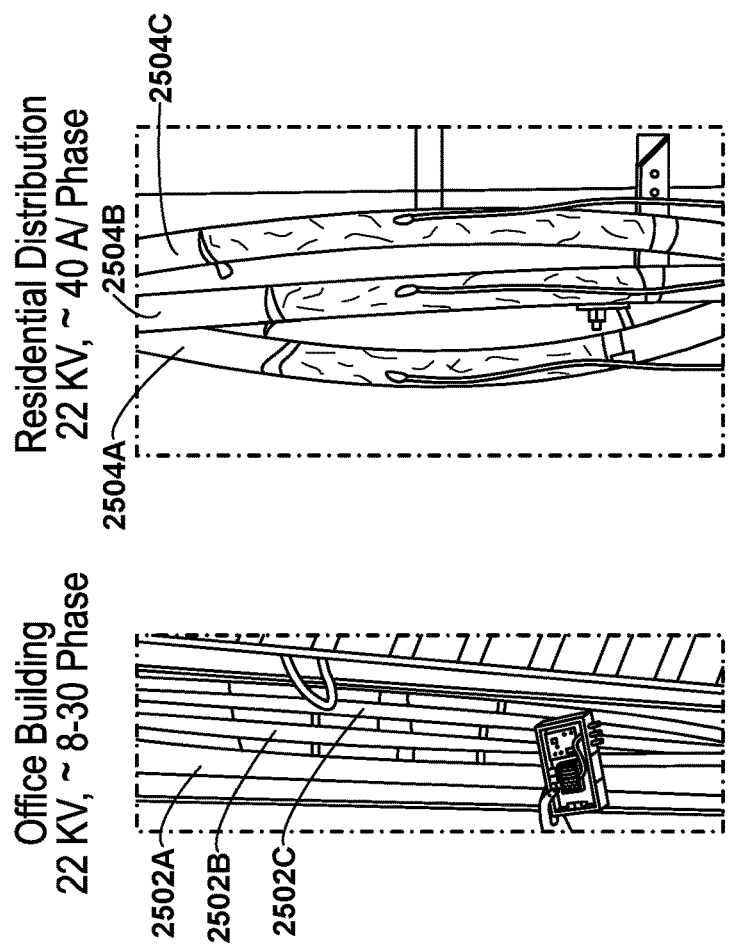
FIG. 25A

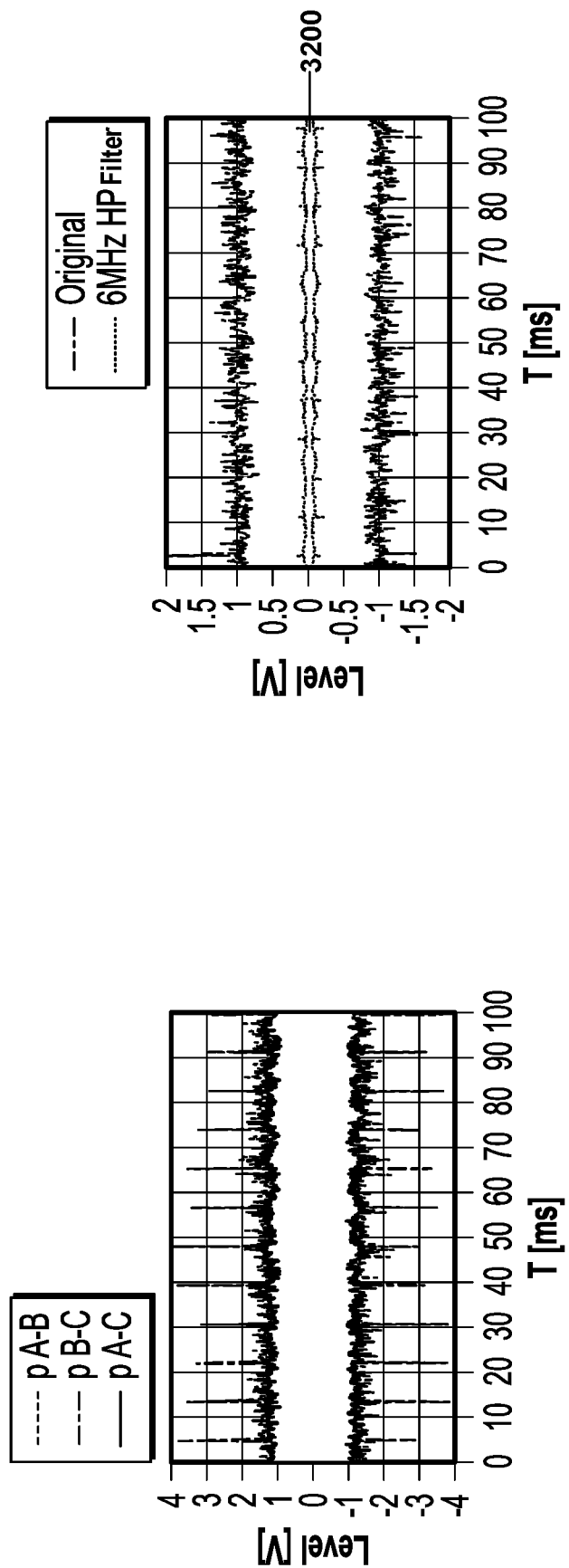

MONITORING SYSTEM FOR EVALUATING A CONDITION OF AN ELECTRICAL GRID

This application claims the benefit of U.S. Provisional Patent Application No. 62/955,500, entitled "ASSEMBLY, METHOD AND SYSTEM FOR SENSING, COMMUNICATING AND/OR CHARACTERIZING A CONDITION OF AN ELECTRICAL GRID FOR ON-LINE DIAGNOSTICS," and filed on Dec. 31, 2019, the entire contents of which are incorporated herein by reference.

TECHNICAL FIELD

The present disclosure relates to the field of electrical equipment, including power cables and accessories, for power utilities and industrial and commercial sites.

BACKGROUND

Electrical power grids include numerous components that operate in diverse locations and conditions, such as above ground, underground, cold weather climates, and/or hot weather climates. When a power grid suffers a failure, it can be difficult to determine the cause of the failure. Sensor systems for power networks, especially underground power networks, are increasingly becoming employed to detect grid anomalies (such as faults or precursors of faults) so that an operator can react more quickly, effectively, and safely to maintain service or return the system to service. Examples of sensor systems include faulted-circuit indicators, reverse-flow monitors, and power-quality monitors. Commonly assigned U.S. Pat. No. 9,961,418, incorporated by reference herein in its entirety, describes an underground power-network-monitoring system that communicates with a central system.

SUMMARY

In general, the present disclosure provides techniques for monitoring electrical equipment of a power grid and predicting the likelihood of failure events of the electrical equipment. The electrical equipment may include cable accessories, which may include a cable splice body or a cable termination body.

In some examples herein, a system includes a node configured to couple to a multiphase electrical power line that includes multiple separate cables, where a first cable and a second cable carry a first phase and a second phase, respectively, each cable including a plurality of concentric layers, the plurality of concentric layers including a first (insulating) layer configured to concentrically surround a central conductor of the electrical cable and comprising an insulating material; a second (shield) layer comprising a conducting material; and a third (jacket) layer including a resistive material configured to resist electrical flow, where the second layer is disposed radially between the first layer and the third layer. The node includes a first coupling layer disposed over the third layer of the first cable and capacitively coupled to the second layer of the first cable and a second coupling layer disposed over the third layer of the second cable and capacitively coupled to the second layer of the second cable. The first and second sensors are differentially coupled to generate a differential data signal. In addition, each of the coupling layers is configured to sense a native signal; inject an intentional signal; receive an intentional signal; or provide a channel characterization. In some examples, the node is configured to retrofit to an existing electrical-power line.

The details of one or more examples of the disclosure are set forth in the accompanying drawings and the description below. Other features, objects, and advantages of the disclosure will be apparent from the description and drawings, and from the claims.

BRIEF DESCRIPTION OF THE DRAWINGS

FIGS. 17A-17C are conceptual diagrams illustrating cross-sectional views of power cables, illustrating an example capacitive coupling placement.

FIGS. 25A-25C are conceptual diagrams illustrating capacitive couplings at example voltage facilities.

FIGS. 32A and 32B are graphs illustrating measurement results for different repeating pulse levels at an example industrial site.

Figure 1:
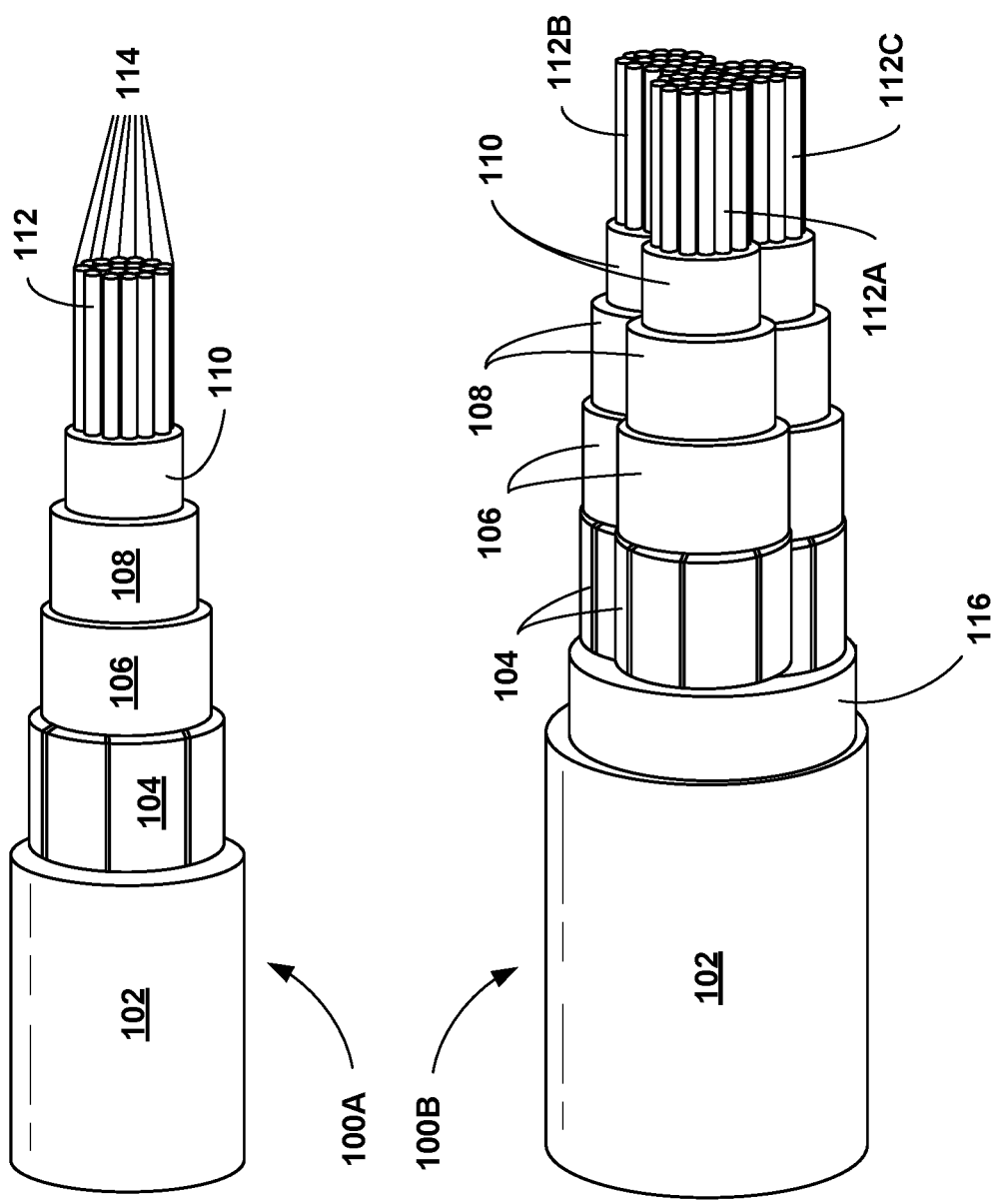
FIG. 1 is a schematic view of an example power cable construction.

It is to be understood that the embodiments may be utilized and structural changes may be made without departing from the scope of the invention. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Examples of the present disclosure include devices, techniques, and systems for sensing, communicating, and characterizing a condition of an electrical grid via a power-line coupling. As such, the example devices described herein include multifunctional (sensing, communication, and characterization) devices. In this aspect, example devices may include a coupling layer that can provide a sensing layer that senses native signals and intentional (e.g., injected) signals. Moreover, the coupling layer may also provide for communication (e.g., signal injection, signal reception) and channel characterization.

Some example techniques herein include coupling a sensing-and-communicating system (e.g. a partial discharge (PD) detection system) onto a medium-voltage (MV) or high-voltage (HV) electrical-power-cable system. In some examples, a PD detection system may be retrofit onto an existing MV or HV cable system, rather than incorporating a PD detection system within a cable system at the time of manufacture of the cable system. In some such retrofit examples, the techniques of this disclosure include coupling the systems without compromising the integrity of the cables, e.g., by cutting the cables or penetrating a radial layer of the cables (e.g., a cable jacket). For instance, the example techniques herein include capacitively coupling a PD detection system to a cable shield of a power cable.

In an example construction, an electrical-power cable includes a plurality of concentric layers. In some examples, the plurality of concentric layers includes at least a first layer configured to concentrically surround a central conductor of the electrical cable and comprising an insulating material; a second layer comprising a conducting material (e.g., a cable shield layer); and a third layer comprising a resistive material (e.g., a cable jacket), wherein the second layer is disposed between the first layer and the third layer. In some examples, a conductor screen can be disposed radially between the central conductor and the insulation layer. In other examples, an insulation screen can be disposed between the shield layer and the insulation layer.

According to examples of this disclosure, a PD detection device can include a coupling layer, such as a metallic foil, to retrofit the device onto an electrical cable at virtually any suitable point, and can be utilized to monitor signals that exist on the shield layer. Some examples of such signals include "intentional" signals, such as incoming communication, or "unintentional" or "native" signals, such as PD. Other intentional signals can be characterizations of the cable that are sent from the same or other nodes.

The example devices and coupling-techniques described herein enable the devices to communicate information, such as PD information, faulted-circuit indicator (FCI) information, electrical-current information, temperature information, or other information. Each coupling layer can be connected to a signal wire that can convey the detected or injected signal to or from a source, detector, processor, or other device. In some embodiments, a protective cover or wrapping can also be utilized to cover or protect the coupling layer and/or signal wire connection.

In accordance with aspects of this disclosure, for distributed networks on an electrical-power grid, example devices are configured to interface with an electrical-power cable with little-to-no modification or other alteration of the power cable, thereby reducing the potential for cable damage. Example systems herein are configured to use these example devices and coupling techniques to communicate along the power line via a power-line-communication technique. In some examples, the devices may be retrofittable to an existing power line. Alternatively, the techniques herein may be applied to example devices that are coupled to (e.g., integrated) with a newly installed power line.

The multifunctional devices described herein can be integrated with various critical monitoring functionalities to support a grid operator in maintaining grid service or returning the grid to service when grid service is unavailable. For example, an FCI can include electrical-current sensing, hardware for processing FCI information, fault logic, communication, and power (e.g., potentially through power harvesting). These systems and devices can readily be packaged in a (secondary) retrofittable node that has communication only along the powerline (e.g., communication only to other nodes in the network). Other supported functionalities can include power-quality monitoring, PD monitoring, discrete-temperature monitoring, fault location, time-domain or frequency-domain reflectometry, incipient fault detection, and other functions. In some examples, these other functions also can be supported by a retrofittable coupling mechanism to reduce the cost per device and complexity of deployment. For enabling communication, in accordance with techniques of this disclosure, the retrofittable coupling system can support communication to a primary, centrally connected node from a secondary, satellite node, or from the satellite node to another secondary node.

Power lines may transmit electrical power from a power source (e.g., a power plant) to a power consumer, such as a business or home. Power lines may be underground, underwater, or suspended overhead (e.g., from wooden poles, metal structures, etc.). Power lines may be used for electrical-power transmission at relatively high voltages (e.g., compared to electrical cables utilized within a home, which may transmit electrical power between approximately 12 volts and approximately 240 volts depending on application and geographic region). For example, power lines may transmit electrical power above approximately 600 volts (e.g., between approximately 600 volts and approximately 1,000 volts). However, it should be understood that power lines may transmit electrical power over any voltage and/or frequency range. For example, power lines may transmit electrical power within different voltage ranges. In some examples, a first type of power line may transmit voltages of more than approximately 1,000 volts, such as for distributing power between a residential or small commercial customer and a power source (e.g., power utility). As another example, a second type of power line may transmit voltages between approximately 1 kV and approximately 69 kV, such as for distributing power to urban and rural communities. A third type of power line may transmit voltages greater than approximately 69 kV, such as for sub-transmission and transmission of bulk quantities of electric power and connection to very large consumers.

Power lines include electrical cables and one or more electrical cable accessories. For example. FIG. 1 depicts two example electrical-power cables 100A and 100B (collectively, "cables 100," or, in the alternative, "cable 100"). Power cable 100A is an example of a single-phase MV cable, e.g., having a single central conductor. Power cable 100A includes jacket or oversheath 102, metal sheath or cable shield 104, insulation screen 106, insulation 108, conductor screen 110, and central conductor 112. Power cable 100B is an example of a three-phase extruded medium-voltage (MV) cable, e.g., having three central conductors. Polyphase cables like cable 100B can carry more than one shielded-conductor 112A-112C within a single jacket 102. Other examples of typical, but not depicted, cable layers include swellable or water-blocking materials that are placed within the conductor strands 114 ("strand fill"), or between various other layers of the cable 100 ("filler 116").

Example cable accessories may include splices, separable connectors, terminations, and connectors, among others. In some examples, cable accessories may include cable splices configured to physically and conductively couple two or more cables 100. For example, a cable accessory can physically and conductively couple cable 100A to cable 100B. In some examples, terminations may be configured to physically and conductively couple a cable 100 to additional electrical equipment, such as a transformer, switch gear, power substation, business, home, or other structure.

In other examples, as detailed further below with respect to FIG. 2, a cable accessory can include a monitoring device 202A, 202B (collectively, "monitoring devices 202," or in the alternative, "monitoring device 202") having one or more sensors, one or more communication devices, and/or one or more power-harvesting devices, which may be electrically coupled to insulation screen 106 of the cable 100 to perform a variety of functions. The one or more sensors can output sensor data indicative of conditions of the cable accessory. Examples of such sensors include temperature sensors, partial discharge (PD) sensors, smoke sensors, gas sensors, and acoustic sensors, among others. The communication unit(s) may transmit sensed data to a remote computing system and/or apply local analytics on sensed data.

According to further aspects of this disclosure, a computing system, such as a remote computing system and/or a computing device integrated within the monitoring device 202 of the cable accessory, determines a "health" of the cable accessory based at least in part on the coupling and/or other sensor data. For example, the computing system may, e.g., in real-time, determine whether the cable accessory 202 will fail within a predetermined amount of time based at least in part on the sensor data. By determining a health of the cable accessories and predicting failure events before they occur, a computing system may more-quickly and more-accurately identify potential failure events that may affect the distribution of power throughout the power grid, or worker and/or civilian safety, to name only a few examples. Further, the computing system may proactively and preemptively generate notifications and/or alter the operation of a power grid before a failure event occurs.

In examples of this disclosure, a retrofittable monitoring device 202 includes a coupling layer that can support the other functionalities that either inject or extract "intentional" signals or those that extract "unintentional" or "native" signals (e.g., partial discharge signals) that can be indicative of impending failure of the cable 100. Intentional signals that support the functionalities above include pulses or chirps that can help characterize the power line (e.g. time-domain retroreflectometry (TDR) or frequency-domain retroreflectometry (FDR)) or time-synchronization signals that synchronize timing between one location and another. Unintentional or native signals of interest on the power line include the AC waveform and anomalies embedded within the AC waveform, or partial discharges (PDs), for example. In addition, because both native and intentional signals are subject to noise interference, a coupling mechanism that eliminates at least some noise is beneficial.

In general, the example systems, devices, and/or techniques described herein can provide a retrofittable coupling mode for cable 100 that can support communication along cable 100 to other parts of a network; a coupling that can support various functionalities for infrastructure monitoring where intentional signals are injected and/or extracted and native signals are extracted; a coupling method that reduces noise; combinations of the retrofit cable communication capability with at least one function and noise reduction; and/or a coupling that supports more than one function.

The signals described herein, including both unintentional native signals (e.g. PD) and intentional signals (e.g. communication signals), may typically include radio-frequency (RF) signals, which lie in the frequency range of about 0.1 to about 10 MHz. Within this frequency range, cable 100 can be considered as a coaxial transmission line, that includes a central conductive core 112, a dielectric insulating layer 108, and a coaxial conducting shield 104 being grounded at one or both of the cable ends. In such a system, at a distance far enough from the ends, the electric potential on both the core conductor 112 and the shield 104 will oscillate relative to ground. Consequently, the signal may be detected by capacitively coupling to the shield 104, e.g., by wrapping a conducting layer 118 (e.g., a conductive metal foil 118 of FIG. 3) over the cable jacket 102, thereby creating a coupling capacitor 120 (FIG. 3) that includes the shield 104, the jacket dielectric 102, and the conducting layer 118.

One example technique for measuring the RF signals is to measure the potential difference between the coupling capacitor 120 and the local ground 420 (FIG. 4), for example by connecting an RF amplifier (e.g., node 402 of FIG. 4) between them. Another approach is to connect the coupling capacitor 120 to a grounded current amplifier and measure the current flowing through the capacitor 120. In the present description, such implementations are referred to as "single-ended."

It is noted that in a single-ended method, it is possible that any RF noise present on the local ground may be injected into the measurements. Additionally, the cables 100 may pick up noise along the way, e.g. by electromagnetic pickup. Finally, there may not be a convenient ground connection available at the installation point.

To address the above issues, the single-ended implementation may be replaced with a "differential" method. For example, FIG. 2 shows a first example where differential capacitive coupling is employed on three cables 100A-100C. As illustrated in FIG. 2, the techniques of this disclosure include differential coupling of a monitoring device (or "communication device") 202 to the cable shields 104 of a cable pair, or in some examples, to the cable shields 104 of at least two distinct cables 100, from which a particular pair of two cables may be subsequently selected by a user. More specifically, the communication device 202 may be physically coupled to the outer jackets 102 of cables 100, but capacitively coupled to the cable shields 104 located underneath the jackets 102. If three cables 100A-100C are available, then there are three potential cable pairs (100A, 100B), (100B, 100C), and (100A, 100C) that are available for coupling. In multi-cable cases having a number "n" of cables 100 wherein n>3, then there are n/2 unique possible combinations of cable pairs that may be selected from among the n cables 100. The communication signal can be multiplexed or repeated on these multiple pairs. This signal can be extracted from a similarly coupled communication device located at a remote location. Each device 202 can sense locally and communicate information, or can act as a repeater to send the information along, or act as a concentrator to collect the information and then send the information to a central location.

Figure 2:
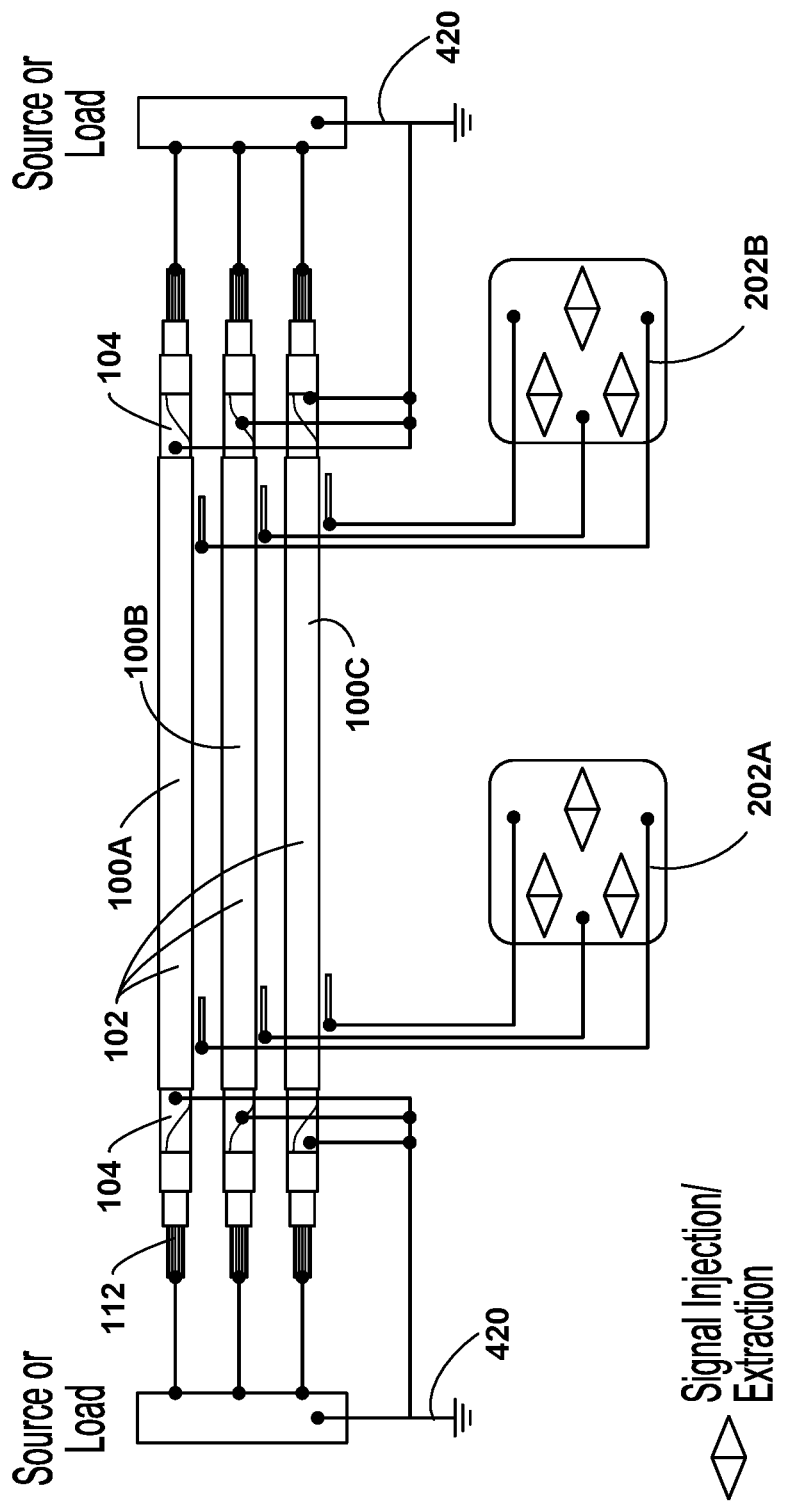
FIG. 2 is a schematic diagram of an example differential coupling system according to techniques of this disclosure.

As shown in FIG. 2, a device 202 may be capacitively coupled to at least two separate cables (e.g., 100B, 100C) associated with two different phases. These cables 100B, 100C can be of the same three-phase group or can be unrelated single phases. A voltage or current amplifier 310C (FIG. 3) may then be connected between the two coupling capacitors 120, thus measuring the potential difference or the current flowing between them. Such an implementation does not require an independent ground, and so entails a "floating" installation that can be easily coupled onto the cable system. Furthermore, a differential approach will be insensitive to any common-mode noise picked up by the system. For example, in a three-phase system (FIGS. 2 and 3), the three cables 100A-100C are laid as a bundle, and accordingly, the cables will pick up approximately the same electromagnetic noise, which a differential setup will then reduce or cancel out. Similarly, if the phases are not in the same three-phase system, the cables can also have similar pick-up.

Another feature of the capacitive coupling to the cable shield 104 is that this approach allows a straightforward approach to inject RF signals into the cable system, e.g., by applying an RF voltage between the coupling capacitor 120 and the ground 420, e.g., for a single-ended system, or differentially between cable pairs. The injected signals may be received similarly to the method used for native signals, as described above. The injection and pickup of such intentional signals may be used for various purposes, such as: communication between devices; time synchronization between devices; time-domain reflectometry (TDR) or frequency-domain reflectometry (FDR) to detect and localize defects, faults and structural changes in the cable system; channel characterization (e.g., frequency dependent loss, propagation delay); and grid configuration/mapping.

In addition, intentional signals may be injected into more than one channel, e.g. into two or more cables 100 or cable pairs. Such a multichannel approach allows an increased communication bandwidth and/or enhanced communication reliability.

It is possible to use the same monitoring device (or "coupling device") 202 for more than one function; thus the same capacitive couplers 120 may be used, e.g., for both PD detection and communication. Also, the coupling device(s) 202 described here can be used by a single monitoring node within a network that has multiple nodes using similar or different coupling devices at the other multiple nodes.

Figure 3:
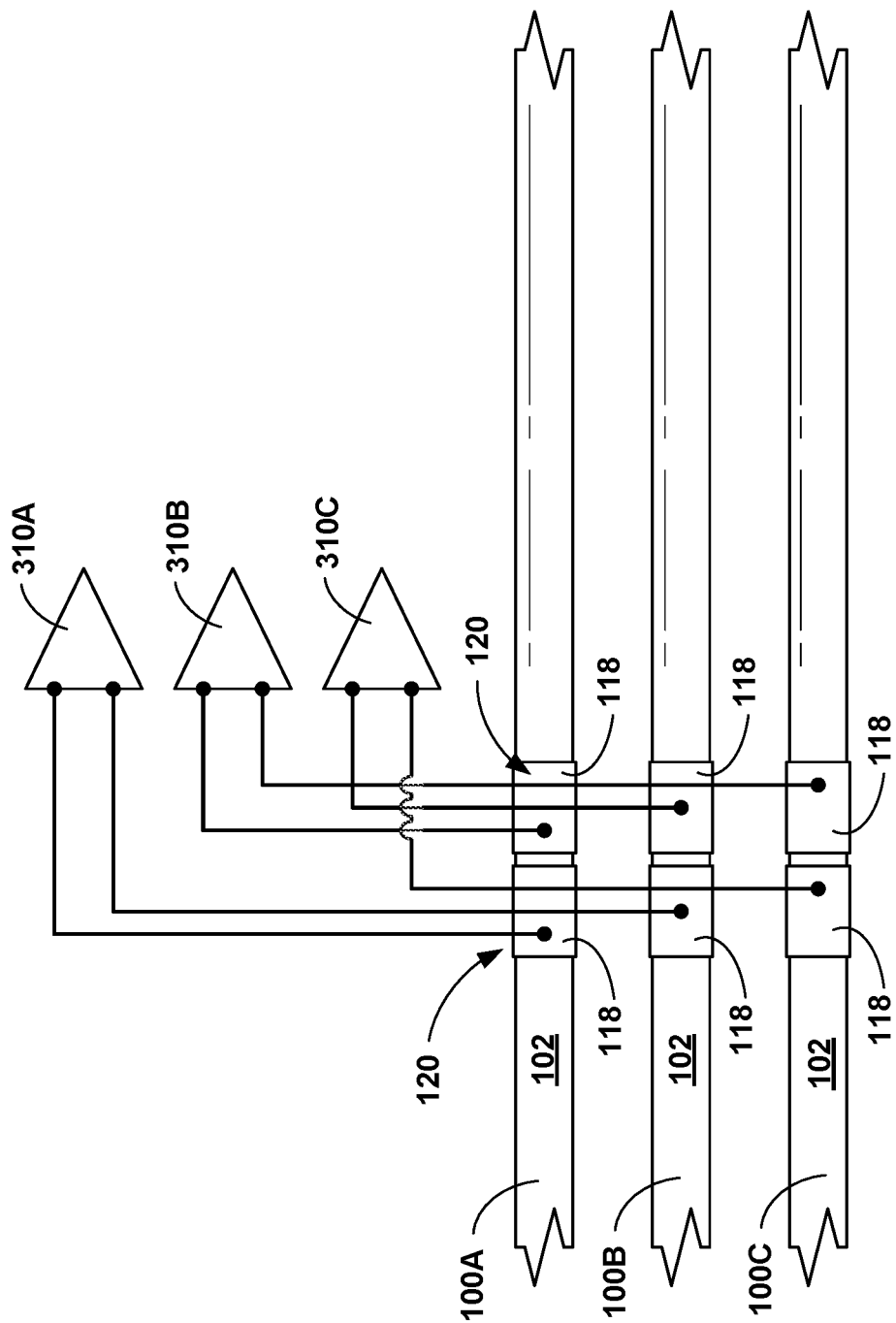
FIG. 3 is a schematic diagram of another example differential coupling implementation according to techniques of this disclosure.

FIG. 3 illustrates a specific coupling solution for the case of current amplifiers. As depicted in FIG. 3, current amplifiers 310A-310C (collectively "current amplifiers 310," or, in the alternative, "current amplifier 310") may be used for coupling, where two foil capacitors 120 on each cable 100 are capacitively coupled to the shields 104 (FIG. 2) via physical coupling to the conducting layer 118 on outer jackets 102. Such examples require separate pairs of capacitors 120 per differential channel, thus preventing unwanted signal leakage between the channels. An alternative is to use one capacitor 120 (e.g., conductive foil 118) for each power cable 100 with a high-impedance voltage amplifier rather than a low-impedance current amplifier 310 where multiple amplifiers 310 can connect to each foil capacitor 120. This single-capacitor-per-cable example is depicted in other figures throughout this disclosure, but it is to be understood that the double-capacitor-per-cable example depicted in FIG. 3 is available an additional or alternative example to any of the single-capacitor examples described herein.

Figure 4:
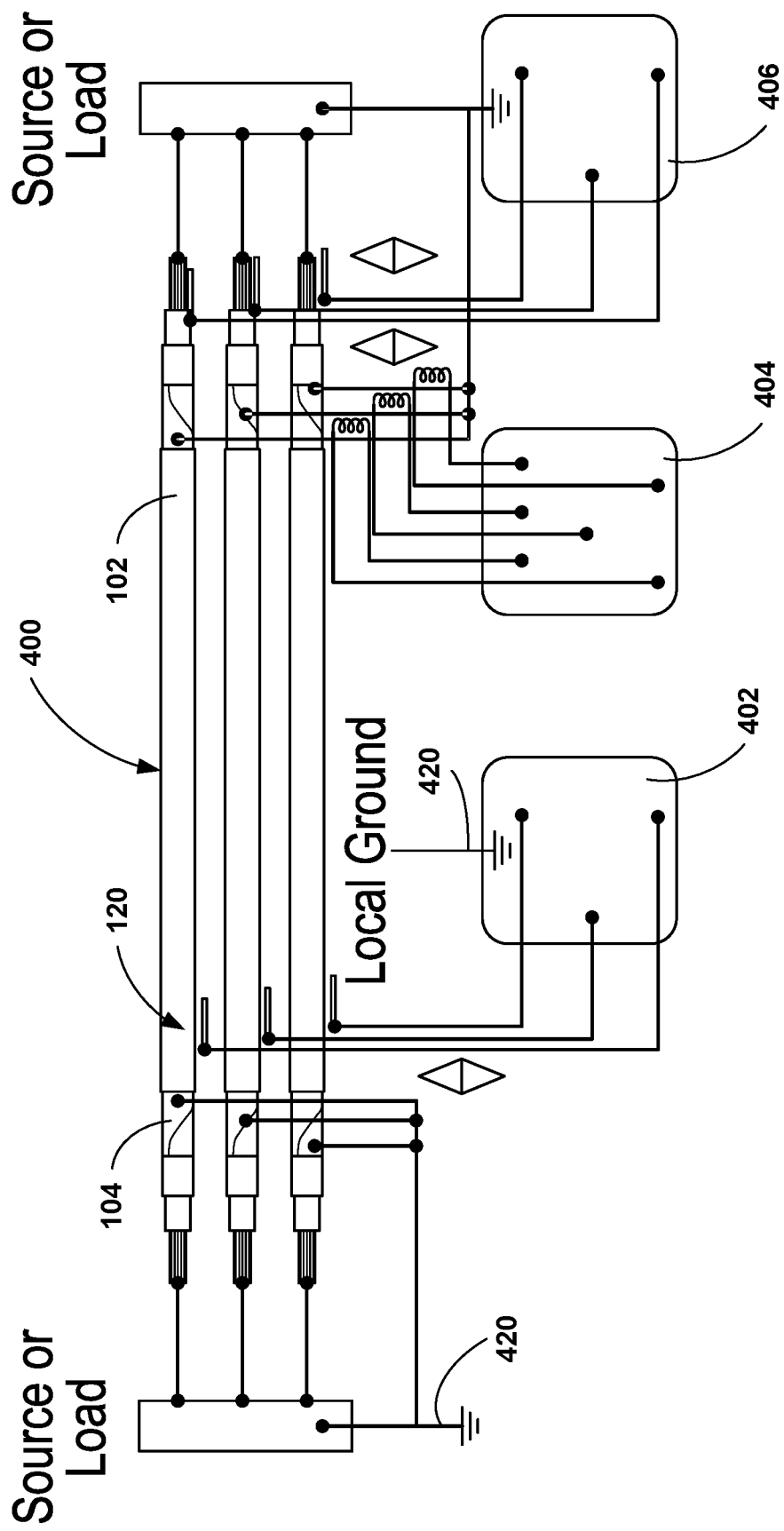
FIG. 4 is a schematic diagram of another example differential coupling system according to techniques of this disclosure.

FIG. 4 is a schematic diagram of another example differential coupling system according to techniques of this disclosure. Whereas FIG. 3 depicted a specific example of differential coupling and cable-shield-104 capacitive coupling, FIG. 4 depicts a more general example of differential or single-ended capacitive coupling to cable shields 104, and also other coupling on the same line or lines to extract or inject other signals of interest (e.g., a communication signal). This other coupling can be single-ended (ground reference) or differential (reference to another voltage).

For instance, FIG. 4 depicts three example cable-monitoring devices 402, 404, and 406. Cable-monitoring device 402 is capacitively coupled to cable shield 104, via a physical coupling overtop of cable jacket 102 (or a cable splice, if present). Cable-monitoring device 402 is an example of a differential or single-ended functional device.

Cable-monitoring device 404 is inductively coupled to cable shield 104, via a physical connection to a wired connection to a local ground 420. Cable-monitoring device 404 is an example of a device that is differential between phases, or a "differential-one-phase-each (DOPE)" functional device.

Cable-monitoring device 406 is capacitively coupled directly to central conductor 112, or adjacent to central conductor 112. Cable-monitoring device 406 is an example of a single-ended functional device.

Figure 5:
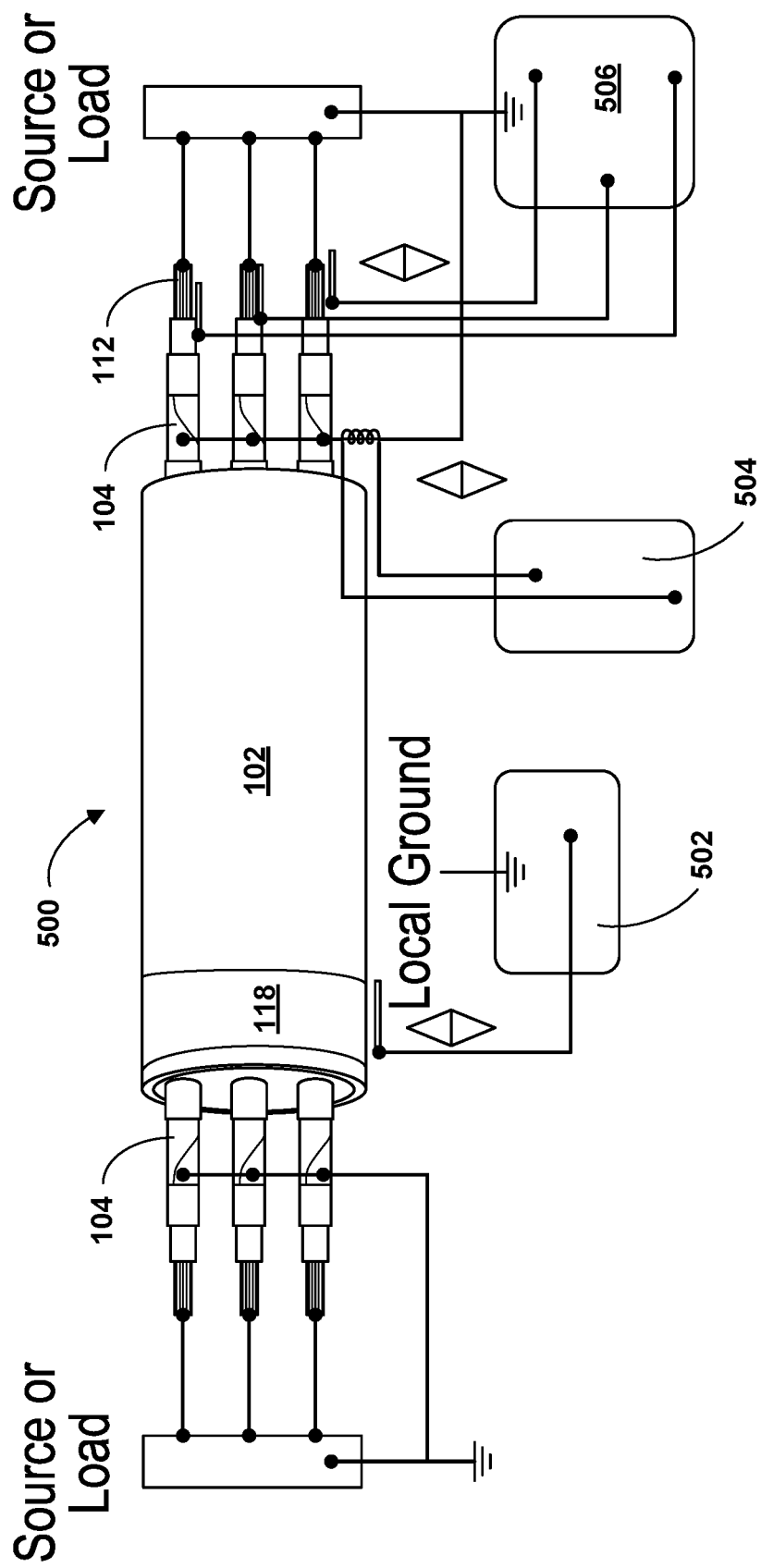
FIG. 5 is a schematic diagram of an example differential coupling implementation on a multiphase cable according to techniques of this disclosure.

FIG. 5 is a schematic diagram of example differential coupling implementations on a multiphase cable 500, according to techniques of this disclosure. As shown in FIG. 5, capacitive coupling can also be employed on a multiphase cable 500 with the ability to also communicate to other devices with other or similar coupling means. FIG. 5 includes a first example cable-monitoring device 502, such as a single-ended functional device, that is capacitively coupled to cable shields 104 via a physical coupling overtop of cable jacket 102 and conductive foil 118, as described above. FIG. 5 further depicts a second example cable-monitoring device 504, such as a differential functional device, that is inductively coupled to cable shields 104. FIG. 5 further depicts a third example cable-monitoring device 506, such as a differential or single-ended functional device, that is capacitively coupled to central conductors 112 of cable 500.

Figure 6:
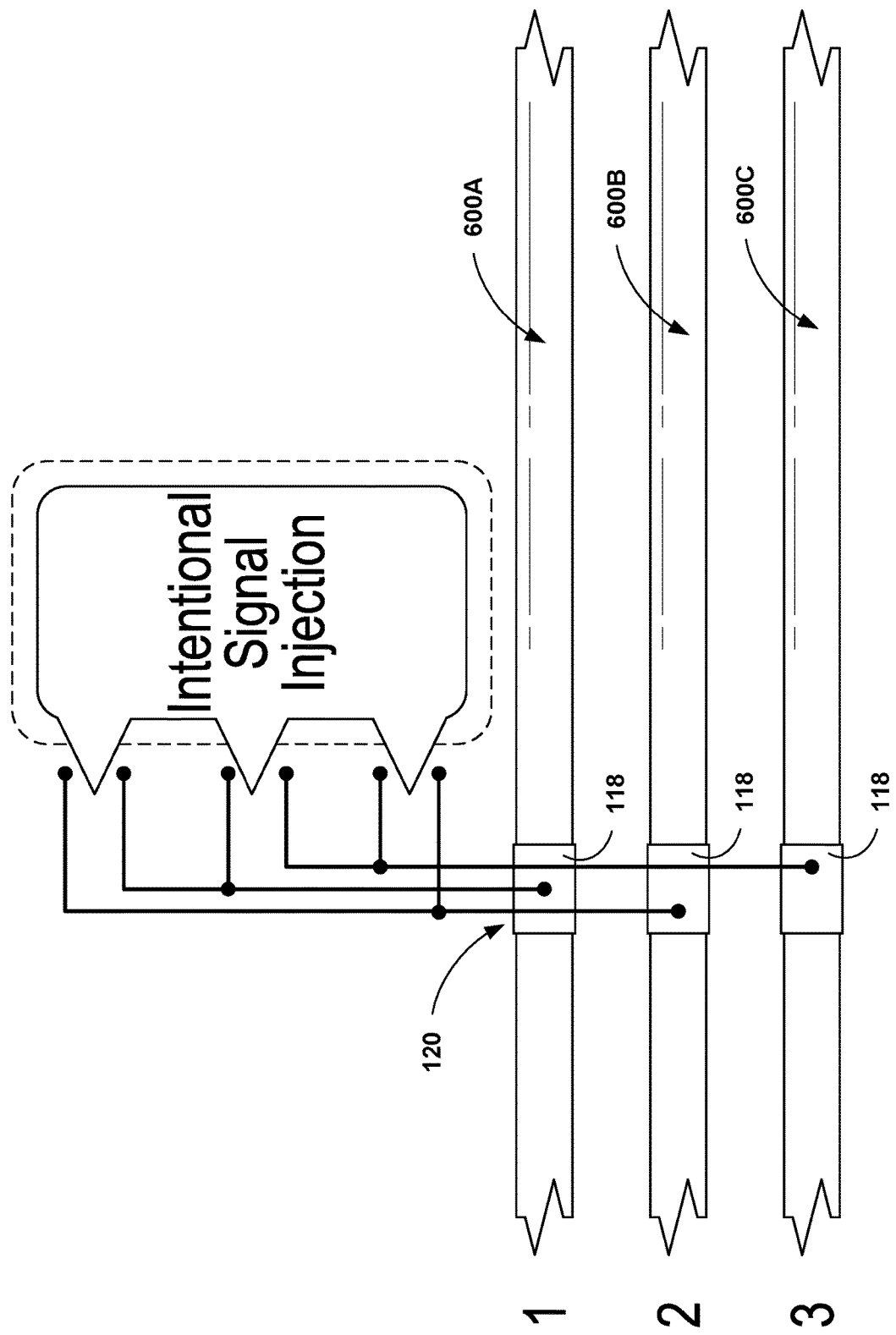
FIG. 6 is a schematic view illustrating intentional signal injection into differential couplers according to techniques of this disclosure.

FIG. 6 is a schematic view illustrating intentional signal injection into differential capacitive couplers 120 of cables 600A-600O, according to techniques of this disclosure. Intentional signals, in addition to communication signals, can be injected into the differential couplers 120. Examples of intentional signals include channel characterization, time domain reflectometry (TDR), fault location, time synchronization, frequency domain reflectometry (FDR), structural-anomaly detection, and other applications. Portions of these intentional signals can be spread across various frequencies and also physically distributed across the 1, 2, 3, or more channels, or can be repeated across the 1, 2, 3 or more channels.

Figure 7:
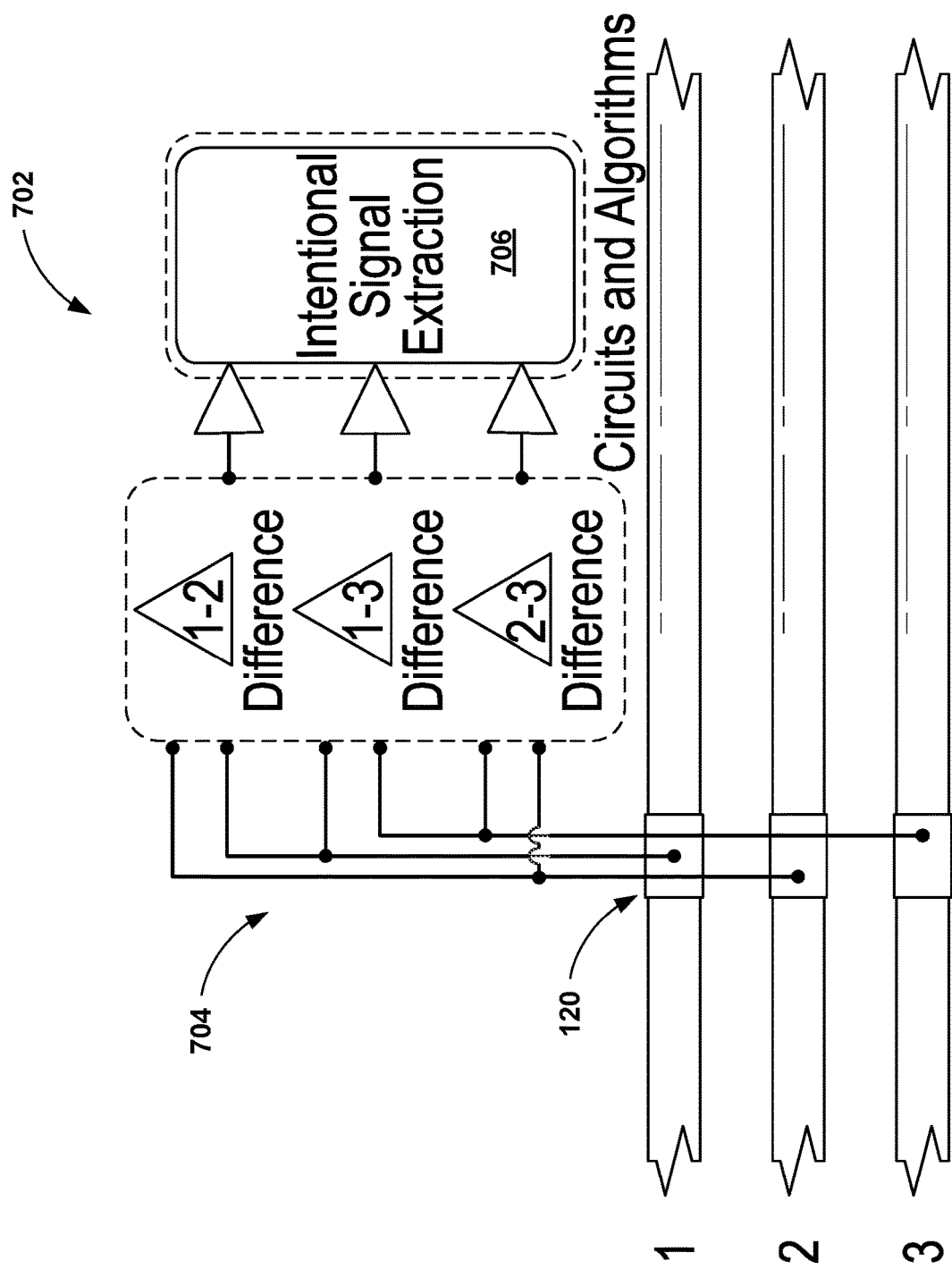
FIG. 7 is a schematic view illustrating intentional signal extraction according to techniques of this disclosure.

FIG. 7 is a schematic view illustrating intentional-signal extraction, according to techniques of this disclosure. For example, FIG. 7 depicts an example cable-monitoring device 702 (e.g., node 202A of FIG. 2) configured to extract the intentional signals through the difference coupling 704 (e.g., the capacitive coupling 120 across any cable pair). The difference coupling 704 has the added advantage of eliminating common-mode noise. Cable-monitoring device 702 includes a differential coupling 704 across every potential cable pair (e.g., cables 1 and 2, cables 2 and 3, and cables 1 and 3). Device 702 further includes corresponding circuitry 706 (configured to execute suitable algorithms) to extract the intentional signals by comparing the differential signals from each cable pair.

Figure 8:
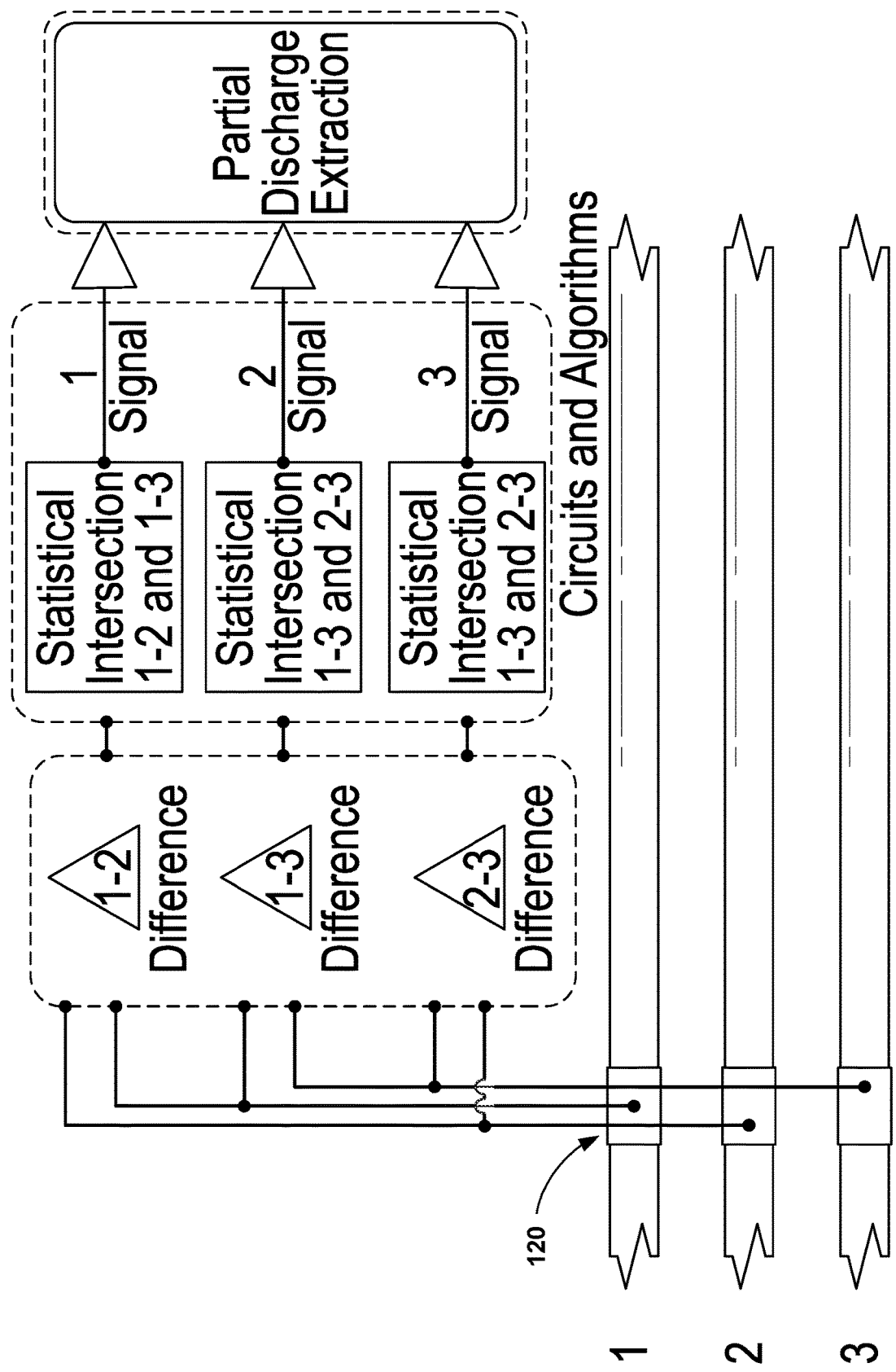
FIG. 8 is a schematic view illustrating partial discharge extraction according to techniques of this disclosure.

FIG. 8 is a schematic view illustrating partial discharge (PD) extraction, or in other words, a determination of which of cable A, cable B, or cable C is the source of a detected PD, according to techniques of this disclosure. The physical cable (1, 2, or 3) associated with PD events can be determined by monitoring three or more cables differentially (as shown), and then determining the common events among the pairs. The cable origin of the PD signal can be estimated by observing which different pairs contain the PD signal and which pairs do not. For example, for two pairs in the three-cable system (e.g., pair 1-2 and pair 2-3), a PD signal in cable 1 would be detected only by the first difference 1-2; a PD signal in cable 2 would be detected by both the first difference 1-2 and the second difference 2-3; and a PD signal in cable 3 would be detected only by the second difference 2-3.

Figure 9:
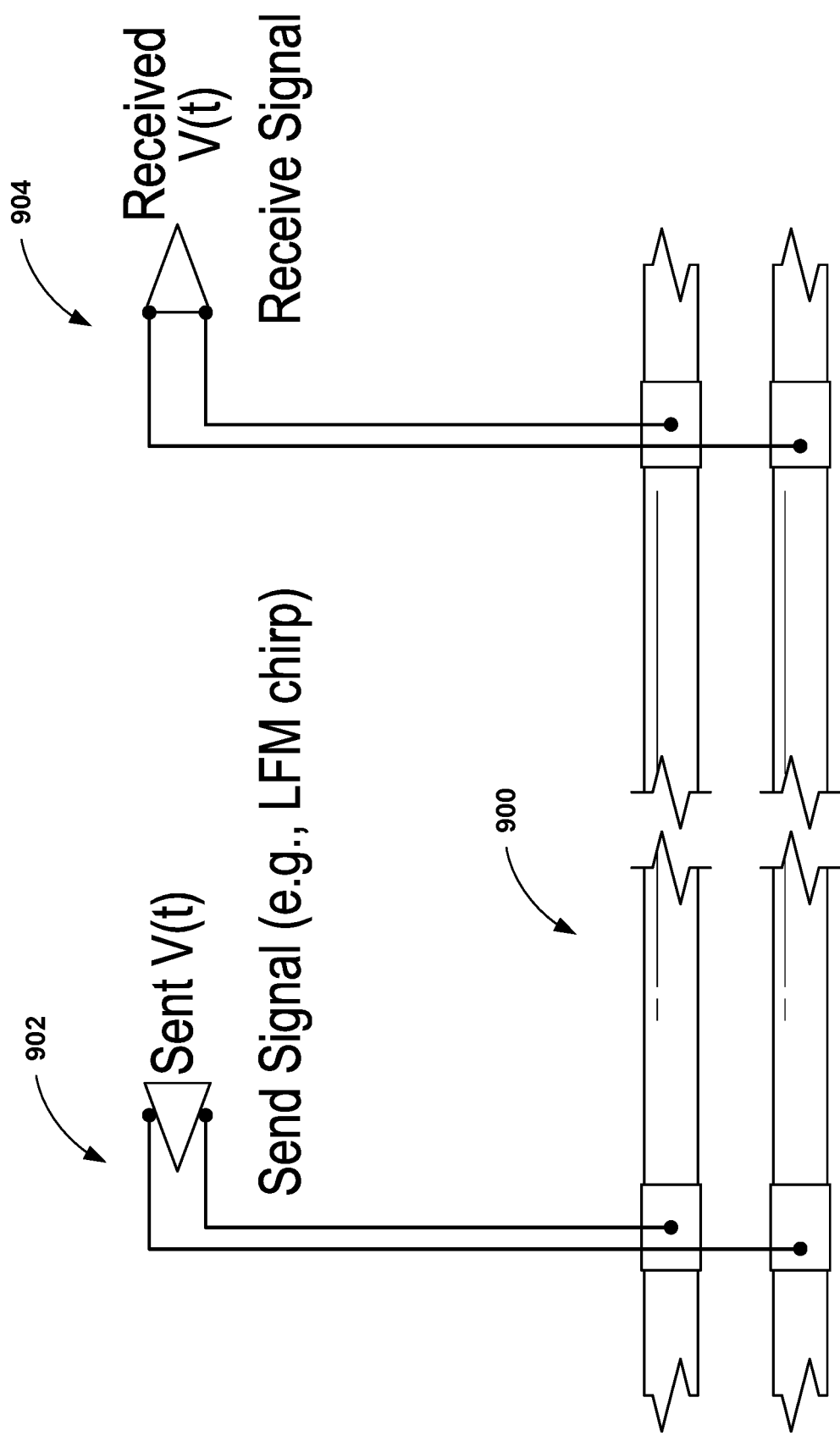
FIG. 9 is a schematic diagram of an example differential coupling system according to techniques of this disclosure.

FIG. 9 is a schematic diagram of an example differential coupling system according to techniques of this disclosure. An intentional signal (e.g. a linear modulated frequency chirp) is sent from a first node 902 (e.g., node 202A of FIG. 2) at a given location, and received at second node 904 (e.g., node 202B of FIG. 2) at another location, in order to characterize the transmission line 900, including establishment of its frequency-dependent transmission characteristics. The original signal will have a controlled form that is known to the receiving node 904, and can be analyzed to extract the dispersion, attenuation and impedance mismatches along the line 900. The signal can be sent in one or both directions. A third, fourth, or any number of additional nodes along the line 900 can also receive and send signals for determination of the line-transmission properties. Once the channel is characterized, the received PD signals of interest can be analyzed by one or more receiving nodes, and the location of origin of the PD can be estimated based on the derived transmission line properties. If the distance between the nodes 902, 904 is known, then the attenuation per given distance can be determined and then used to estimate the distance to any given PD source.

Figure 10:
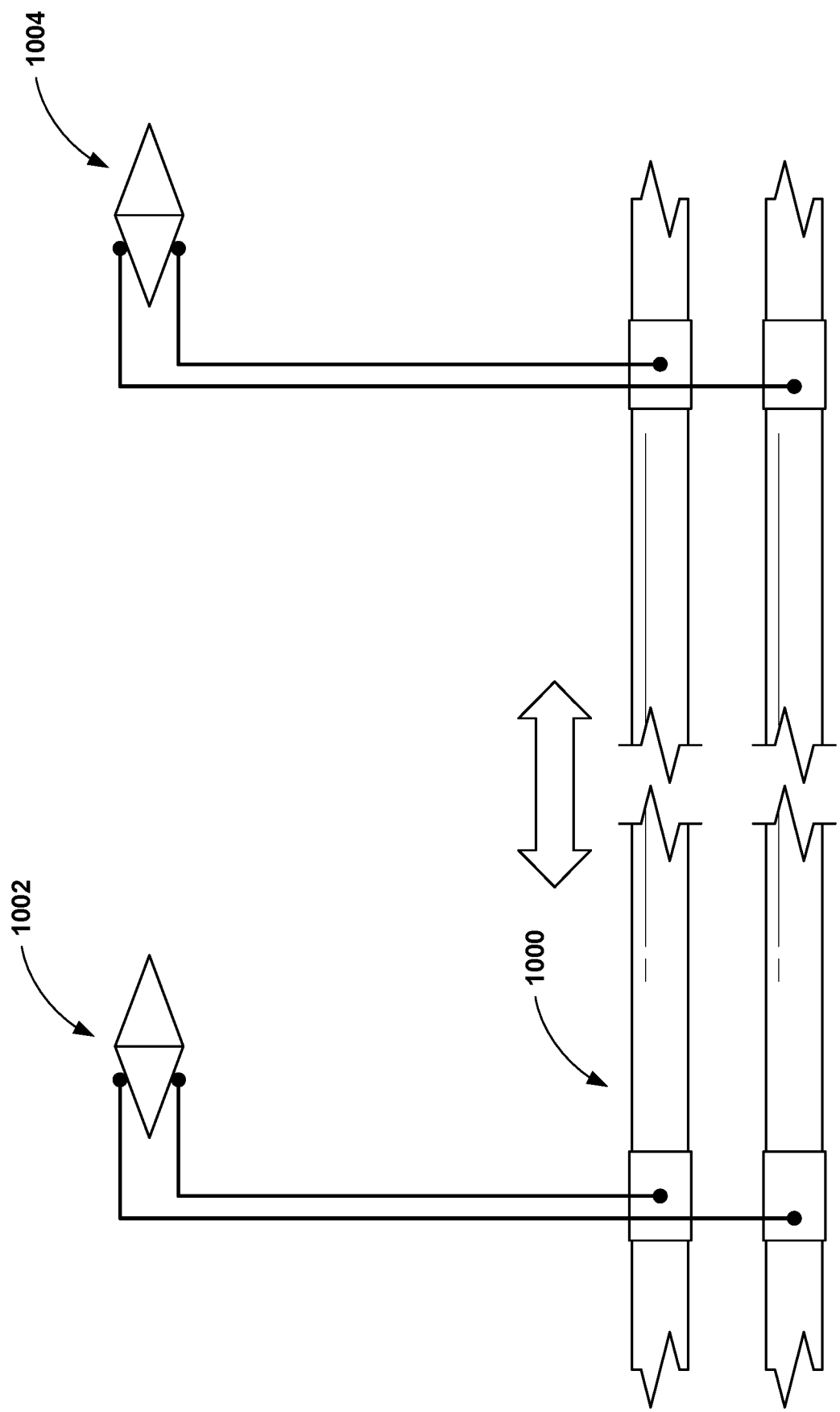
FIG. 10 is a schematic diagram of an example differential coupling system illustrating a measurement method according to techniques of this disclosure.

FIG. 10 is a schematic diagram of another example differential coupling system illustrating a measurement method according to techniques of this disclosure. In a transponder node, a cable propagation delay can be determined through one of many measurements along the cable 1000. For example, an interrogating intentional signal can be sent by a first node 1002 (e.g., node 202A of FIG. 2). When detected by a second node 1004 (e.g., node 202B of FIG. 2), a known intentional response signal could be sent back after a known time delay. The response signal can be detected by the first node 1002 and the time difference between the interrogation signal and the detected response signal can be measured. The delay time and detection time can be subtracted to yield the propagation delay between the two nodes 1002, 1004. With a known distance, the propagation velocity on the physical line 1000 can be determined, or alternatively, if the propagation velocity is known, the distance can be determined. Although two nodes 1002, 1004 are shown, multiple nodes can operate simultaneously in a pair-wise manner as described, or several return signals from several nodes can be generated from the same original signal.

Figure 11:
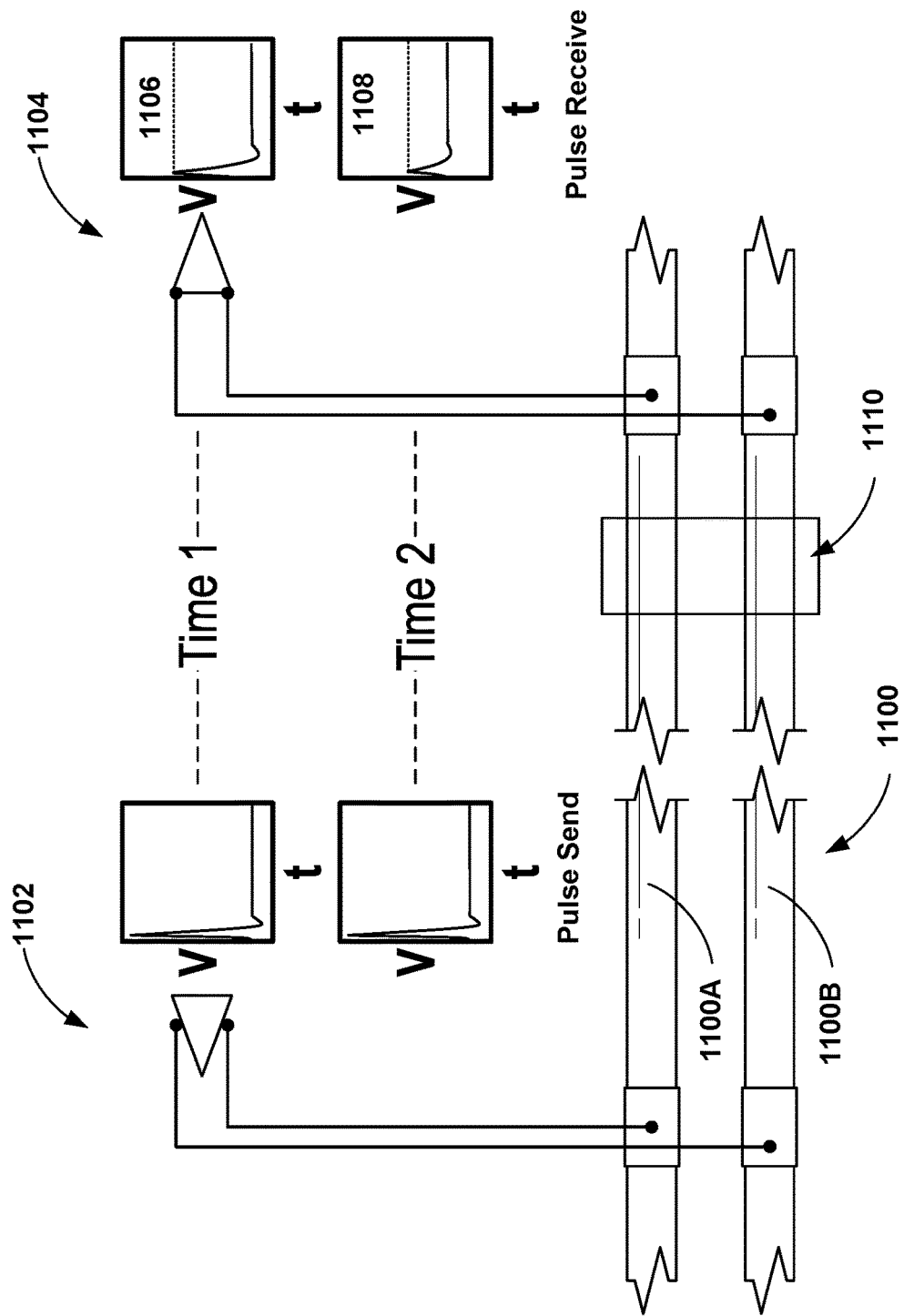
FIG. 11 is a schematic diagram illustrating an example pulse signal injection and extraction according to another embodiment of the invention.

FIG. 11 is a schematic view of an electrical-cable monitoring system, illustrating example techniques for pulse-signal injection and extraction in accordance with this disclosure. An intentional pulse from one node 1102 (e.g., node 202A of FIG. 2) to another node 1104 (e.g., node 202B of FIG. 2) can be used to determine any significant structural changes in the transmission line 1100 over time. For instance, if the receiving node 1104 detects a change between the pulse 1108 received at Time 2 compared to the pulse 1106 received at Time 1 (e.g., due to structural changes at a point 1110 in cable(s) 1100), then the operator can be alerted that a change has occurred. Non-limiting examples of structural changes 1110 include damage to the cable shield 104 or the conductor 112 (FIG. 1), degradation of a splice between the nodes 1102 and 1104, or environmental changes such as water presence and/or temperature changes. Any of these example structural changes may cause a change in electrical impedance at some point 1110 within one or both of cable(s) 1100A, 1100B between nodes 1102 and 1104, and between Time 1 and Time 2, resulting in the observed change in the received pulse 1106, 1108 over time.

Figure 12:
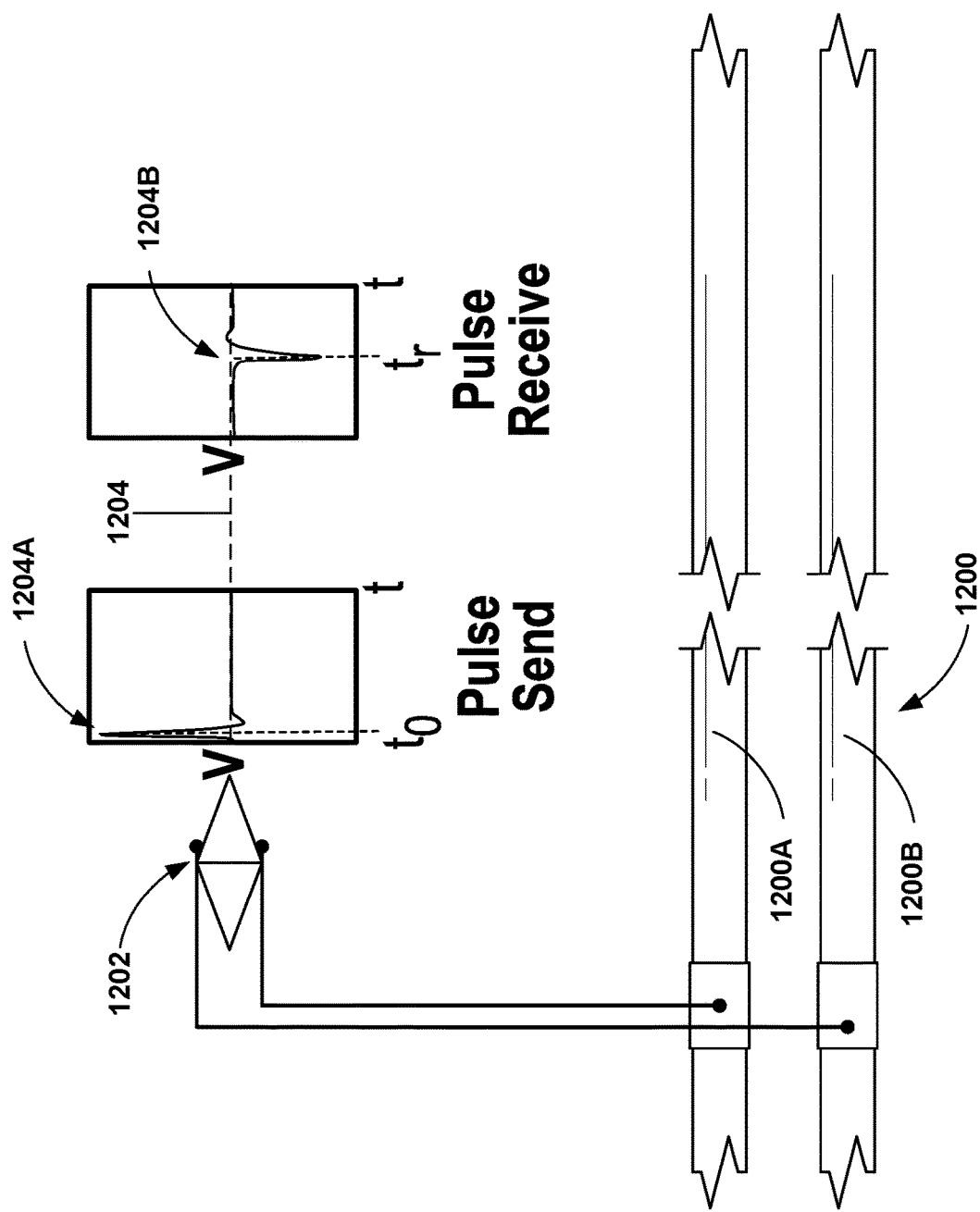
FIG. 12 is a schematic diagram illustrating an example intentional signal extraction according to techniques of this disclosure.

FIG. 12 is a schematic view of another cable-monitoring system, illustrating example techniques for intentional-signal extraction in accordance with this disclosure. A pulse 1204 can be sent (1204A) and received (1204B) by the same node 1202 (e.g., node 202A of FIG. 2) to determine the transmission-line characteristics and also monitor significant changes in the transmission line 1200 that indicate an emerging electric potential or other acute defect, such as damage to the shield 104 or conductor 112 (FIG. 1). The time delay between send (1204A) and receive (1204B) can be used to estimate the distance to the structural element defining an impedance change that is reflecting the signal 1204. The physical cable 1200A, 1200B of transmission line 1200 on which the impedance change is located can be extracted using the combination of responses from multiple lines.

Figure 13:
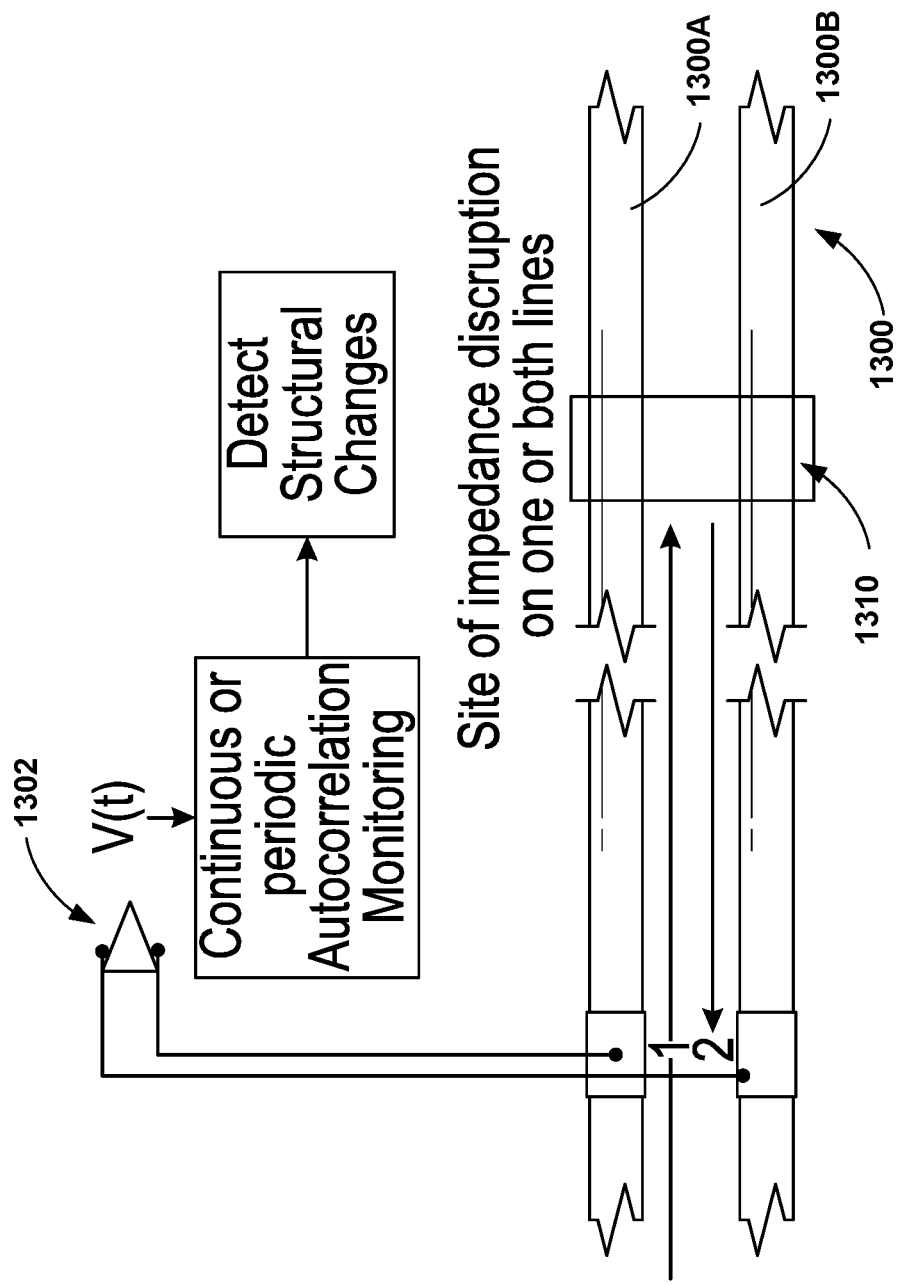
FIG. 13 is a schematic diagram of an example differential coupling system according to techniques of this disclosure.

FIG. 13 is a schematic diagram of another example differential coupling system according to techniques of this disclosure. Voltage monitoring with autocorrelation analysis can be used to detect structural changes or other disruptions 1310 along the cable(s) 1300A, 1300B. A node 1302 (e.g., node 202A of FIG. 2) monitors all voltage variations, regardless of whether they are intentional signals or native noise to the transmission line 1300. For instance, these voltage variations can be the result of pick-up noise, switching noise, PD, intentional signals from a different node, or other causes. The node 1302 then also detects a corresponding reflection of the same voltage pattern as it interacts with an impedance mismatch 1310 along the cable 1300. Autocorrelation analysis can be used to map an original voltage pattern "1" onto a delayed copy of the voltage pattern "2," thereby determining an initial reference state with an intermediate time delay (e.g., determined based on the distance from the voltage reflection at point 1310). A structural change in the physical line 1300A, 1300B will result in a change in the time delay and also possibly a detectable change in the magnitude of the autocorrelated signal. The system can then alert an operator about this change, and can estimate a distance to the structural change 1310 if the propagation delay is known or can be estimated.

Figure 14:
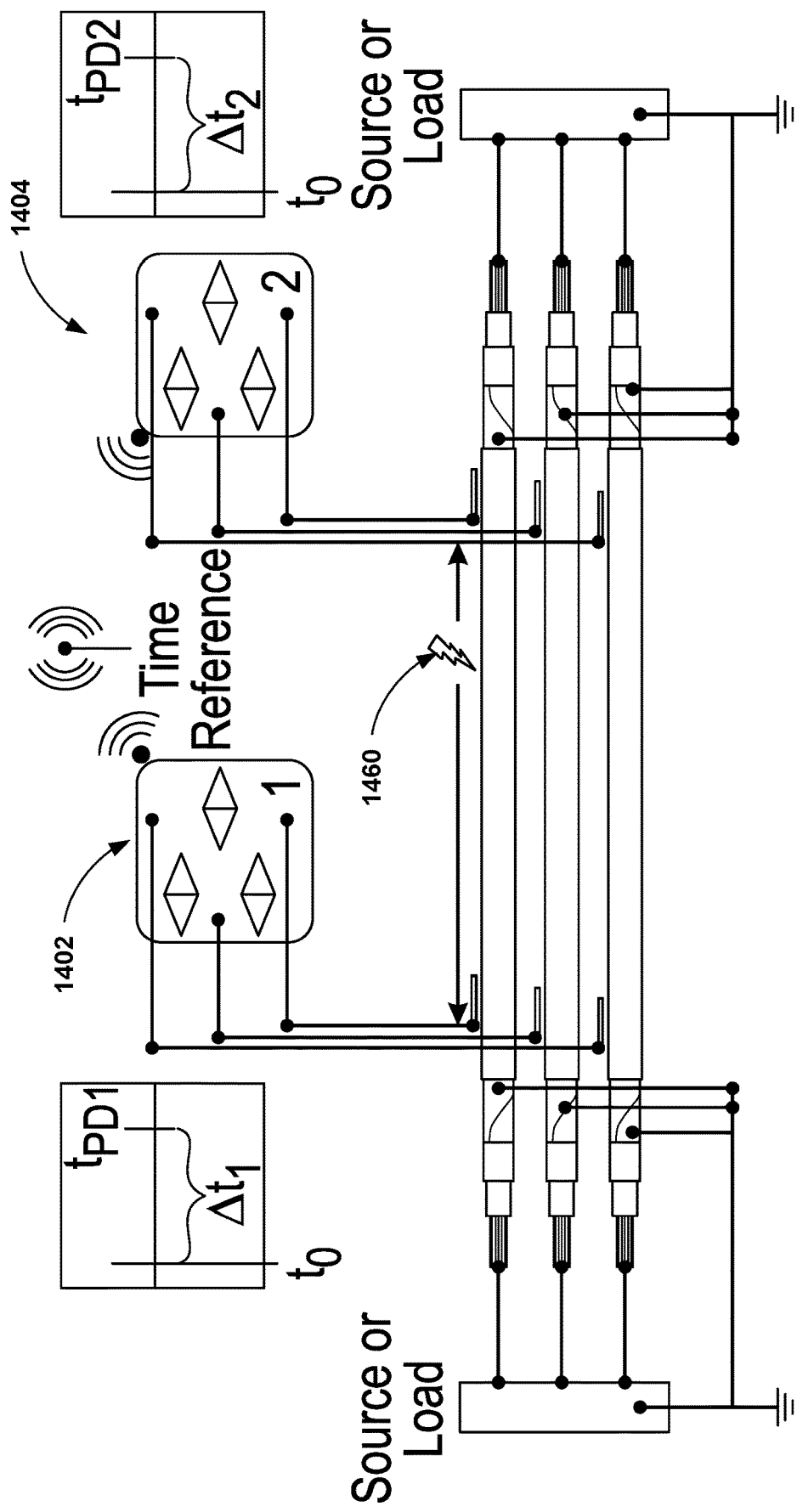
FIG. 14 is a schematic diagram of an example differential coupling system as utilized to determine the location of a partial discharge source, according to techniques of this disclosure.

FIG. 14 is a schematic diagram of another example differential coupling system as utilized to determine the location of a PD source 1460, according to techniques of this disclosure. One method to estimate the location of a PD source 1460 between two or more detection sites 1402, 1404 (e.g., nodes 202 of FIG. 2) is to synchronize the clocks at each site and record the arrival time of a PD event at both sites. The synchronization can be wired or wireless (e.g. GPS-based). The PD arrival time relative to the absolute time is recorded for each site 1402, 1404 and the sites then communicate the information to a central location, to a signal-concentration location, or to another location, and the difference in PD-event-arrival time is calculated. This time difference is then used to estimate the relative location 1460 between the sites 1402, 1404. If the site separation is known, then the distance to the PD source 1460 from one of the locations 1402, 1404 can be determined.

Figure 15:
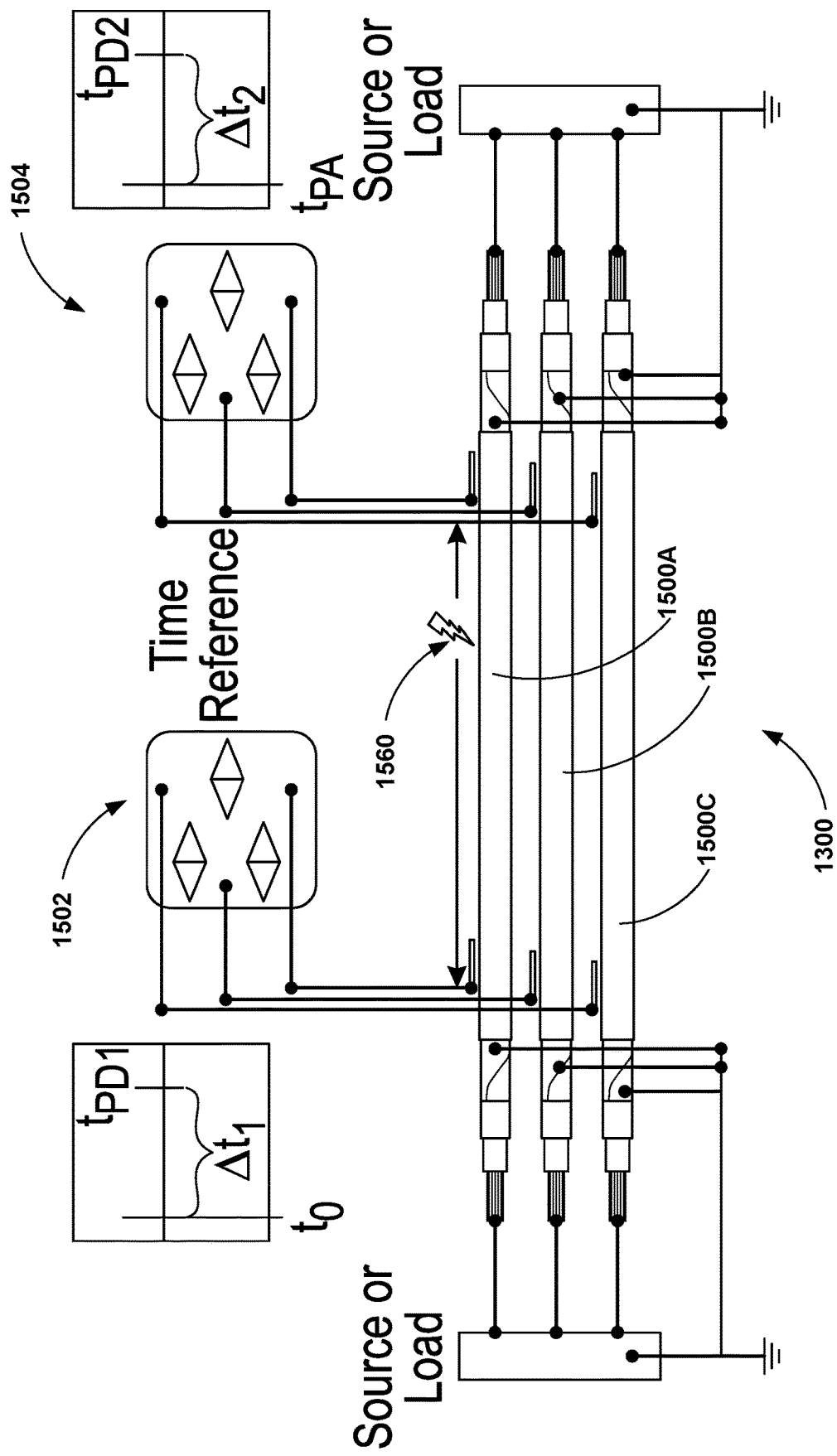
FIG. 15 is a schematic diagram of an example differential coupling system as utilized to determine the location of a partial discharge source, according to techniques of this disclosure.

FIG. 15 is a schematic diagram of another example differential coupling system as utilized to determine the location of a PD source 1560, according to techniques of this disclosure. Another method of determining the PD source 1560 is to use a timing signal sent along the cables 1500A-1500C from one or more sites 1502, 1504 (e.g., nodes 202 of FIG. 2), where the PD-signal arrival time and the timing-signal arrival time are measured. In some such examples, node 1502 sends the timing signal, and the PD signal is measured relative to the timing of the timing signal sent at node 1502 and the received timing signal received at node 1504. Comparison of these time differences provides an estimation of the location of PD source 1560. Knowledge of the propagation delay on the line 1500 can further improve the estimation of the location of PD source 1560.

Various examples of the systems (e.g., assemblies), devices (e.g., nodes) and techniques (e.g., methods) described herein can be utilized in power-line monitoring, and can include the following example configurations, which are shown and described with respect to FIGS. 2-15, as referenced and described above. In a first example configuration, illustrated generally in FIGS. 4 and 5, a cable-monitoring device (e.g., node 402, node 502) includes a capacitive coupling 120 to the ground shield 104 of a cable 100 and to a local ground 420. This configuration can provide the following functionality: (1) provision of a system with other nodes (404, 406, 504, 506) that inject an intentional signal using the same or other means: (2) detection of native system signals, like partial discharge signals; (3) detection of intentional signals generated at another node; (4) detection of return signals sent from the same node; and (5) the use of adaptive noise cancellation to remove common-mode noise between cables 100 (400, 500), so as to leave only the phase-unique PD signal.

In a second example, a device (e.g., node 202A of FIG. 2) of a cable-monitoring system includes a capacitive coupling 120 to the ground shield 104 to two or more power cables (100A-100C) and provides differential noise rejection for receiving intentional and native signals on the cables. This configuration can provide the following functionality: (1) provision of a system that uses intentional signal injection with differential and capacitive coupling or other means (e.g., as in FIGS. 2, 4, 6, 9, 10, 11, and 12); (2) detection of native system signals like PD (e.g., as in FIGS. 4 and 8); (3) detection of intentional signals generated at another node (e.g., as in FIGS. 9, 10, and 11); (4) detection of return signals sent from the same node (e.g., as in FIG. 12); (5) the use of more than one differential coupling pair to discriminate which power line 100 contains the signal of interest (e.g., as in FIG. 8); and (6) the use of adaptive noise cancellation to remove common-mode noise between cables 100, so as to leave only the phase-unique PD signal.

In another example, a device (e.g., node 202A of FIG. 2) includes the use of a current sensor (e.g. high-frequency current transformer, or "HFCT") fitted on one or more cables 100 and measuring the net current in the cable(s) 100, in conjunction with the capacitive sensors and adaptive noise-cancellation algorithms to remove noise from the signal.

In yet another example, a device (e.g., node 404 of FIG. 4) includes a differential inductive coupling to the cable shields 104 or ground extensions to two or more cables 100 (e.g., between the cables 100) for intentional signal injection or extraction, or native signal extraction. This example configuration can be used in a system with at least another node with the same or other coupling.

In yet another example, a device includes a capacitive coupling 102 to the ground shield 104 of a cable 100 and to a local ground 420, and injects an intentional signal (e.g., as in FIGS. 4 and 5).

In yet another example, a device includes a capacitive coupling 120 to the ground shields 104 of two or more cables 100 and differentially injecting an intentional signal (e.g., as in FIG. 2). This example configuration can be utilized in in a system with other nodes that inject intentional signal using the same or other means (e.g., as in FIGS. 2, 4, 6, 7, and 9-12). Available functionality includes communication, for example, where capacitive coupling 120 (to the cable shields 104) enables the creation of a differential data channel on a pair of cables 100 (e.g., as in FIGS. 2, 4, 6, 7, and 9-12); and the communication can be multiplexed along more than one pair of cables 100. Available functionality also includes channel characterization, where, for example, channel frequency response measurement using known signal (e.g., a chirp or pulse) injection (e.g., as in FIG. 9) can be accomplished. The channel characteristics can be used to: (1) estimate distance to PD source based on measured PD signal shape; (2) monitor the condition or environmental changes along the cable length over time such as temperature, water content in and around the cable, and dielectric degradation; (3) sense the presence of existing or emerging structural defects or changes in the grid layout (switch position, new equipment or branches); (4) provide propagation delay estimation by measuring time delay from launch of a signal to the reception of a signal over a known or estimated distance: and/or (5) measure the time of flight and infer the distance between nodes, by sending a signal from one node to the other and sending back a response within a known time period (e.g., as in the "transponder" example of FIG. 10).

In yet another example configuration, a cable-monitoring system can also be used for anomaly detection and localization. In this example configuration, the system can provide, for example, time synchronization, e.g., repeated synchronization-signal injection at some or all nodes used by receiving node side to lock-on-to and synchronize its local clock, followed by receiving and reporting arrival (or launch) local times of this signal and native signals (e.g., PD signal) of interest at this node and others (e.g., as in FIGS. 14 and 15); passive TDR using native noise and anomalies and autocorrelation analysis to detect emerging structural changes in the power lines 100 or equipment (e.g., as in FIG. 13); active TDR using injected intentional signals, such as pulses or wideband chirps, and listening for reflections from faults and structural changes (e.g., as in FIGS. 11 and 12); pulse transmission from one node to another to detect structural changes between the two nodes, including grid layout such as switch position and new equipment or branches (e.g., as in FIG. 11); and/or repeated time of flight (ToF) measurements to monitor changes in the cable properties, due to, e.g., temperature changes, water presence or ageing between two nodes. (e.g., as in FIGS. 9-12).

Figure 16:
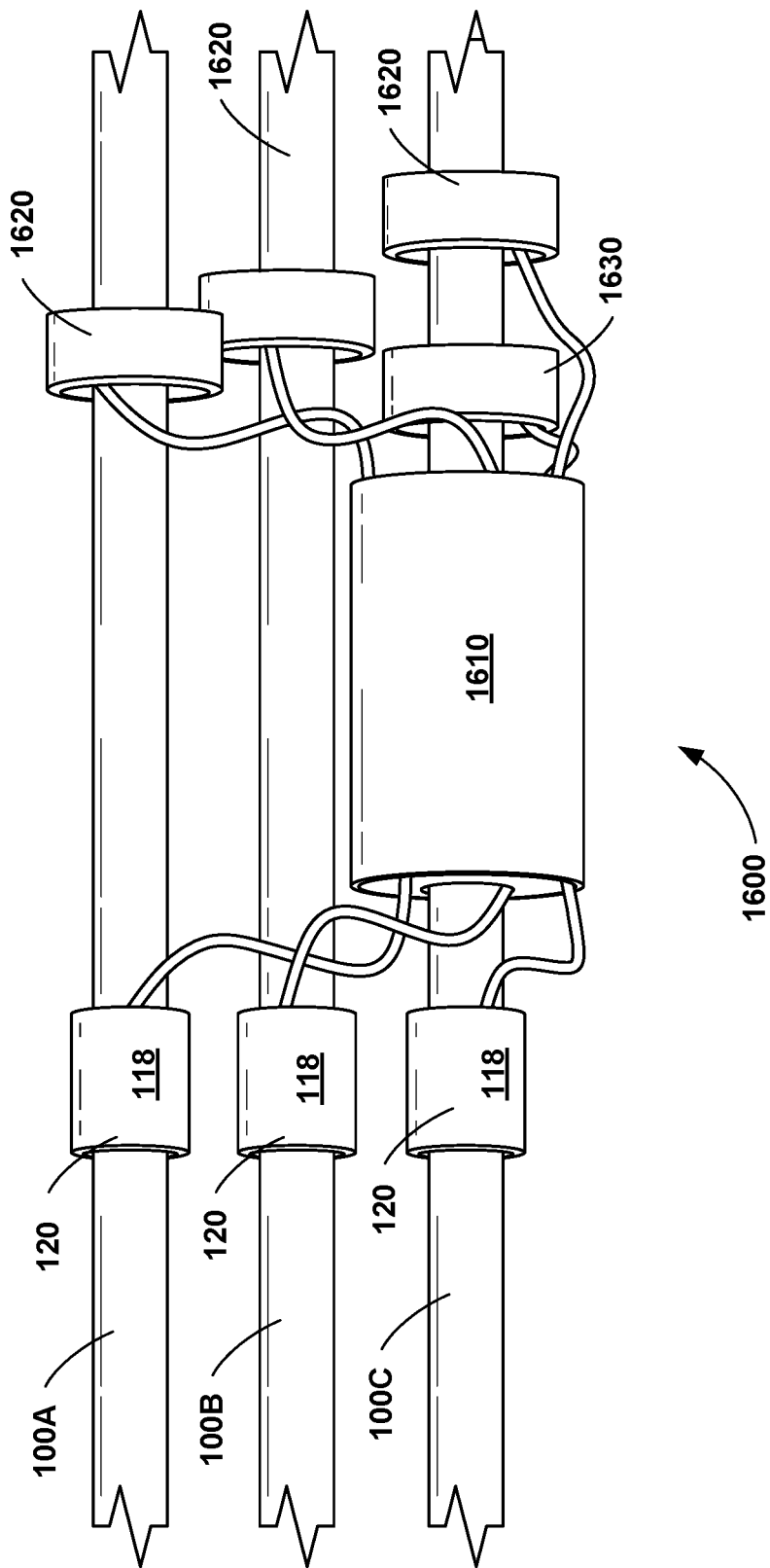
FIG. 16 is a schematic diagram of an example retrofittable device, according to techniques of this disclosure.

In yet another example, FIG. 16 shows an example device enabled by the coupling techniques of this disclosure (e.g., the capacitive coupling as shown and described with respect to FIGS. 2 and 3), having some or all of the example functionalities described above. More specifically, FIG. 16 is a schematic diagram of an example cable-monitoring device 1600, configured to be retrofittable on power cables 100A-100C, and utilizing capacitive coupling 120 for one or more functions (non-limiting examples of which are provided herein). Common-mode noise can be reduced through the use of differential signal injection and extraction. The main hardware unit is mounted on a cable in this example, but can be placed on anywhere locally. Also, some or all the components can be integrated (e.g., combined) into fewer discrete components than those shown in FIG. 16.

As shown in FIG. 16, cable-monitoring device 1600 includes a main hardware unit 1610, a set of capacitive couplings 120 (as described above), additional sensors 1620, and an optional energy-harvesting unit 1630.

Main hardware unit 1610, in conjunction with the other components of FIG. 16, is configured to provide the example functionalities described above, including, but not limited to: PD signal extraction, measurement, and analysis; PD localization; power regulation (e.g., via power-regulation circuitry); transmission and receipt of data communication along cables 100; wireless communication; transmission and receipt of time-synchronization signals; autocorrelation analysis (e.g., of corresponding voltage signals, as described above); electrical-impedance measurement; TDR; FDR fault detection and localization; temperature measurement; current measurement; FCI with logic; power-quality analysis; reverse-power-flow analysis; waveform capture and analysis; incipient fault detection; structural anomaly detection; gas or liquid (e.g., water) detection; and functionality as a transponder for signal-propagation delay.

As described above (e.g., with respect to FIGS. 2 and 3), capacitive couplings 120 may each include a foil-like conductor 118 wrapped around at least a portion of cable jacket 102 (as shown in FIG. 17), so as to capacitively couple main hardware unit 1610 to cable shield 104 (FIG. 1) of each cable 100. Additional sensors 1620 may include, as non-limiting examples, temperature sensors, current sensors (e.g., Rogowski coils), chemical sensors, high-frequency current transformers, or other sensors. Energy harvesting unit 1630 is inductively coupled to cable 100C in order to draw electrical energy in order to power the functionality of main hardware unit 1610.

FIGS. 17A-17C show example components of a capacitive coupling device (or a "capacitive coupling") of a node of a cable-monitoring system for a single-phase cable. More specifically, FIGS. 17A-17C are cross-sectional views of power cable 100A of FIG. 1, illustrating example placements for capacitive couplings 1720B, 17200, which are examples of capacitive coupling 120 of FIG. 3. As shown in FIG. 17B, the capacitive coupling 1720B can be added to a portion (e.g., less than a whole) of the cable periphery (e.g., outer perimeter or circumference). Alternatively, in the example shown in FIG. 17C, the capacitive coupling 1720C can be added around the entire cable periphery.

As shown in FIG. 17B, capacitive coupling 1720B can include an outer dielectric cover or housing 1722; an optional ground plane 1724 and dielectric separator 1726, configured to minimize the reception of external electromagnetic interference (EMI); and a sensing (e.g., conductive) layer 1728, which is an example of foil layer 118 of FIG. 3.

The capacitive couplings 1720B, 1720C can be implemented with an electrical equipment management system (EEMS), such as cable-monitoring device 1600 of FIG. 16, for monitoring electrical power cables 100 of an electrical power grid. The EEMS may allow authorized users to manage inspections, maintenance, and replacement of electrical equipment for a power grid and to adjust operation of the power grid.

In general, the EEMS can provide data acquisition, monitoring, activity logging, data storage, reporting, predictive analytics, and alert generation. For example, the EEMS may include an underlying analytics engine for predicting failure events of articles of electrical equipment, and/or an alerting system for reporting the predicted failure events, in accordance with various examples described herein. In general, as used herein, a "failure event" may refer to the interruption of electrical-power delivery between an electrical-power source and an electrical-power consumer, for example, caused by deterioration or breakage of an article of electrical equipment (e.g., a cable splice).

The EEMS can provide an integrated suite of electrical equipment management tools and implements various techniques described herein. That is, the EEMS can provide a system for managing electrical equipment (e.g., electrical cables 100, splices, transformers, etc.) within one or more physical environments, which may be cities, neighborhoods, buildings, construction sites, or any physical environment. An example EEMS and components thereof are described in commonly assigned International Patent Application No. PCT/US2019/049801, entitled "ELECTRICAL POWER CABLE MONITORING DEVICE USING LOW SIDE ELECTRODE AND EARTH GROUND SEPARATION," filed Sep. 5, 2019, and incorporated by reference in its entirety herein.

FIGS. 18-32 illustrate various example experimental setups, results, and analyses for cable-monitoring systems, particularly cable-monitoring systems that are capacitively coupled to a conductive shield 104 of an electrical cable 100, in accordance with techniques of this disclosure, and as described above. For instance, in an initial experiment, the actual capacitance of a conductive foil 118 over a MV cable 100 may be measured between the foil 118 and the shield 104 for several different types of cables 100 e.g., while foil 118 is applied around the entire circumference of cable 100 (as shown in FIG. 17C). The capacitance may be measured to be about 500 pF to about 1000 pF per meter of cable 100.

Figures 18A, 18B:
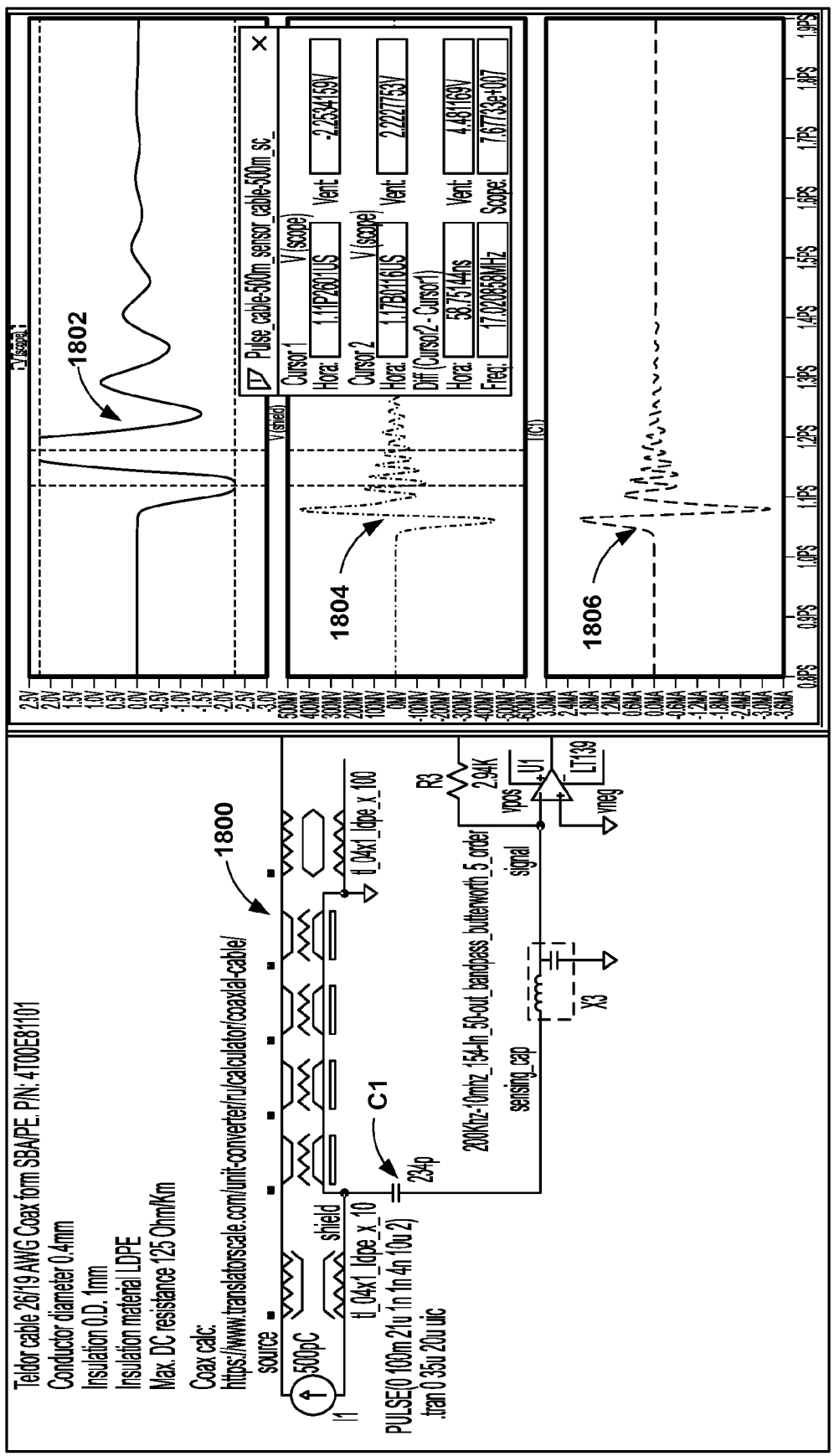
FIGS. 18A and 18B are conceptual diagrams illustrating example measurements for a single-ended simulation.
Figure 19:
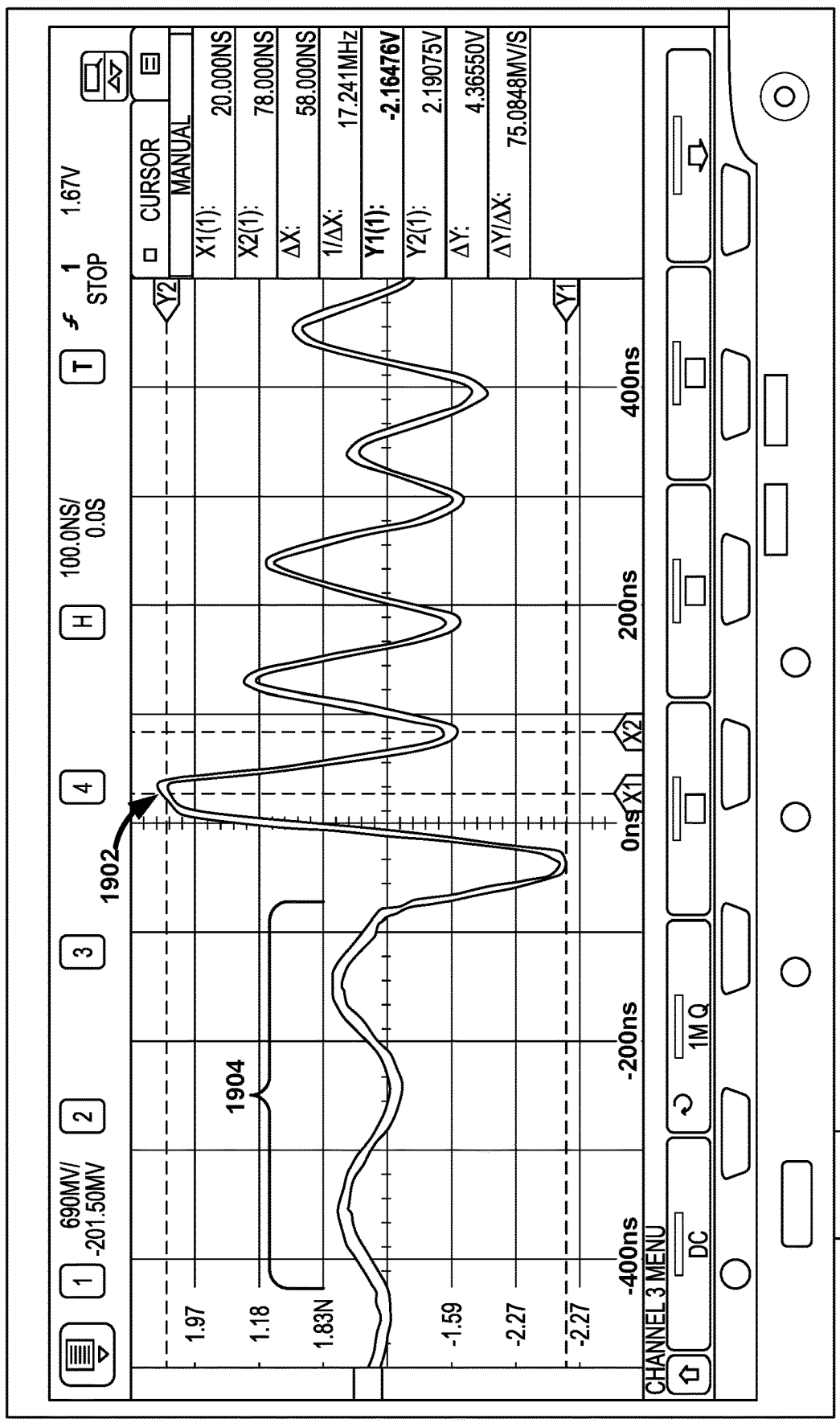
FIG. 19 is a conceptual diagram illustrating example measurements for a single-ended simulation.

In another experiment, a single-ended test may be conducted, as illustrated and described with respect to FIGS. 18A, 18B, and 19. The single-ended experimental setup may include a 1-meter-long section of a conventional, medium-voltage (MV) cable 100, wrapped with approximately 23-cm-long copper foil 118. One side of the MV cable 100 may be connected to a 10-meter-long coaxial cable, wherein the conductor 112 of the MV cable 100 is connected to the conductor of the coaxial cable, and the shield 104 of the MV cable 100 is connected to the shield of the coaxial cable. Further, a PD calibrator and simulator that can produce PD signals with controlled charge may also be connected. The other end of the MV cable 100 may similarly be connected to 100 meters of coaxial cable, which may be used to test distant reflections caused by the cable end from the point of interest, and to test the effect of the shield 104 being grounded away from the point of interest. Open-ended and 50-Ohm-termination variations may be shown to not have any statistically significant effect on the results. The 100-meter coaxial cable may have its shield exposed at about 2 meters, 3 meters, 4 meters, and 10 meters off the MV cable 100.

A current amplifier 310 (FIG. 3) with a frequency band of 0.2-10 MHz may be connected between the copper foil 118 and the ground 420. The ground 420 may be connected to the shield of the 100-meter coaxial cable at one of the exposed points.

This single-ended setup may be simulated (as shown in FIGS. 18A and 18B) and the results may be verified in a laboratory. For instance, FIGS. 18A and 18B show example measurements for the single-ended simulation, in which the potential difference is measured between a coupling capacitor 120 and a local ground 420 (e.g., as in FIG. 4), for example, by connecting an RF amplifier between them, or in other examples, by connecting the coupling capacitor 120 to a grounded current amplifier and measuring the current flowing through the capacitor 120. More specifically, FIG. 18A illustrates a simulated circuit 1800 with a source of 500 pC, coupled via about 10 meters of coaxial cable to a target cable section. A signal is measured through capacitor "C1" and referenced to a grounding point which is about 4 m away. FIG. 18B illustrates the circuit output voltage (to an oscilloscope) 1802, the voltage 1804 on a "shield" point, and the electrical current 1806 through capacitor C1.

FIG. 19 illustrates another example single-ended simulation in a relatively "quiet" (e.g., relatively high signal-to-noise ratio) laboratory environment with the reference ground point about 4 meters along the end coaxial cable and a 500 pC signal showing the received signal (1902) and noise (1904). A partial-discharge signal may be shown to be detectable (e.g., as shown in FIG. 19) by an oscilloscope only when the grounding point 420 is at about 2 meters, 3 meters, and 4 meters away from the MV cable 100; otherwise the noise may be too large with a signal of 100 pC, 200 pC, and 500 pC, respectively, in a laboratory electromagnetic environment. However, in the absence of this unwanted noise, the simulation (e.g., as in FIGS. 18A and 18B) and the results (e.g., as in FIG. 19) may be shown to match.

Figure 20A:
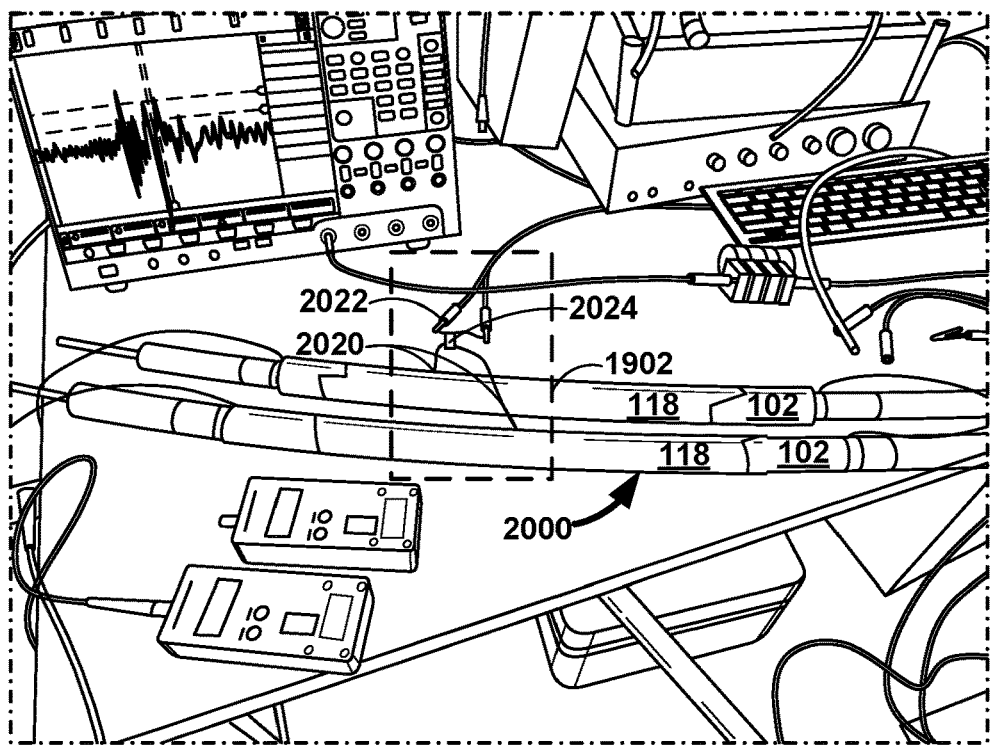
FIGS. 20A and 20B are conceptual diagrams illustrating an example capacitive-coupling experiment.

In another example experiment, a differential coupling test may be conducted in accordance with the techniques of this disclosure, as shown and described with respect to FIGS. 20A-22. For instance, FIGS. 20A and 20B illustrate an example set-up for a differential capacitive-coupling experiment, in accordance with the techniques described above. FIG. 20A depicts medium voltage (MV) cables 2000 with capacitive coupling 2020 (e.g., capacitive coupling 120 of FIG. 3) connected to coaxial cables 2022. Dashed box 2010 highlights the differential connection to the RF transformer 2024. FIG. 20B depicts cable extensions (e.g., two 100-meter parallel cables 2030) connected to the ends of the MV cables 2000. In some cases, the experimental setup for a differential coupling test (as shown in FIGS. 20A and 20B) may include two 3-foot pieces of a conventional MV cable 2000, covered with an approximately 1-foot-long copper foil 118. One end of each MV cable 2000 may be connected to a 10-meter-long coaxial cable 2022, with the conductor 112 of the MV cable 2000 connected to the conductor of the coaxial cable 2022 and the shield of the MV cable connected to the shield of the coax cable 2022, and one of the lines may be connected to a PD-calibrator-and-simulator. The other ends of the MV cables may similarly be connected to two 100-meter coaxial cables 2030 reeled together (such that they run in parallel).

The two copper foils 118 may be connected to the primary port of a 1:1 RF transformer 2024, and the secondary port of the transformer may be connected to a current amplifier. It is noted that this example experimental setup does not require a grounding point 420.

Figure 20B:
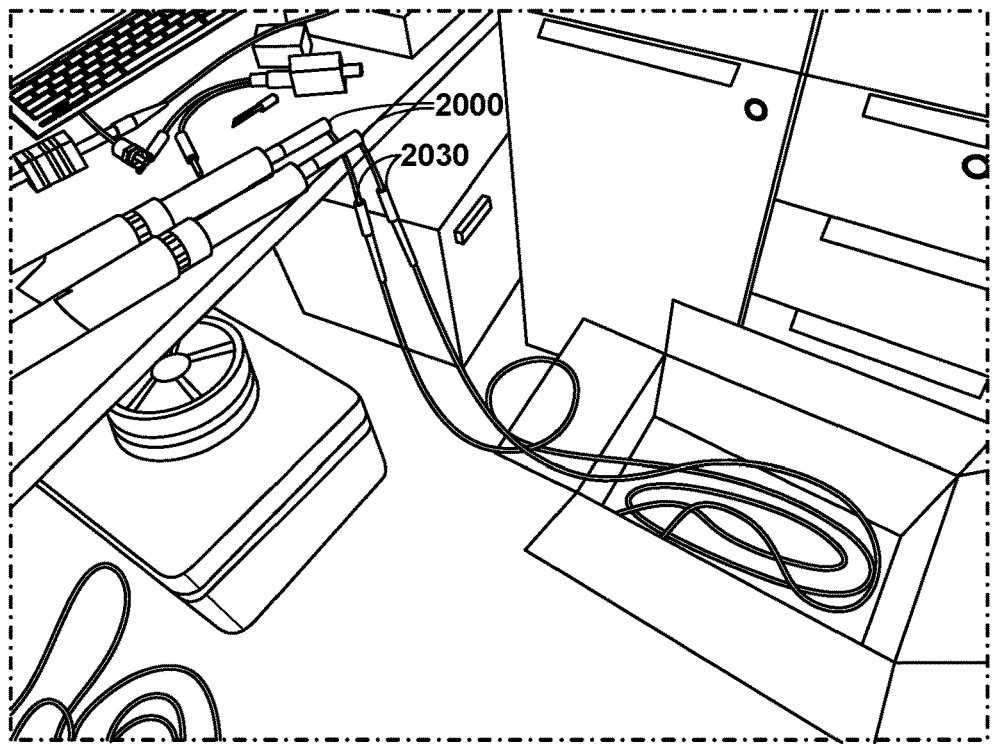
Figure 21A:
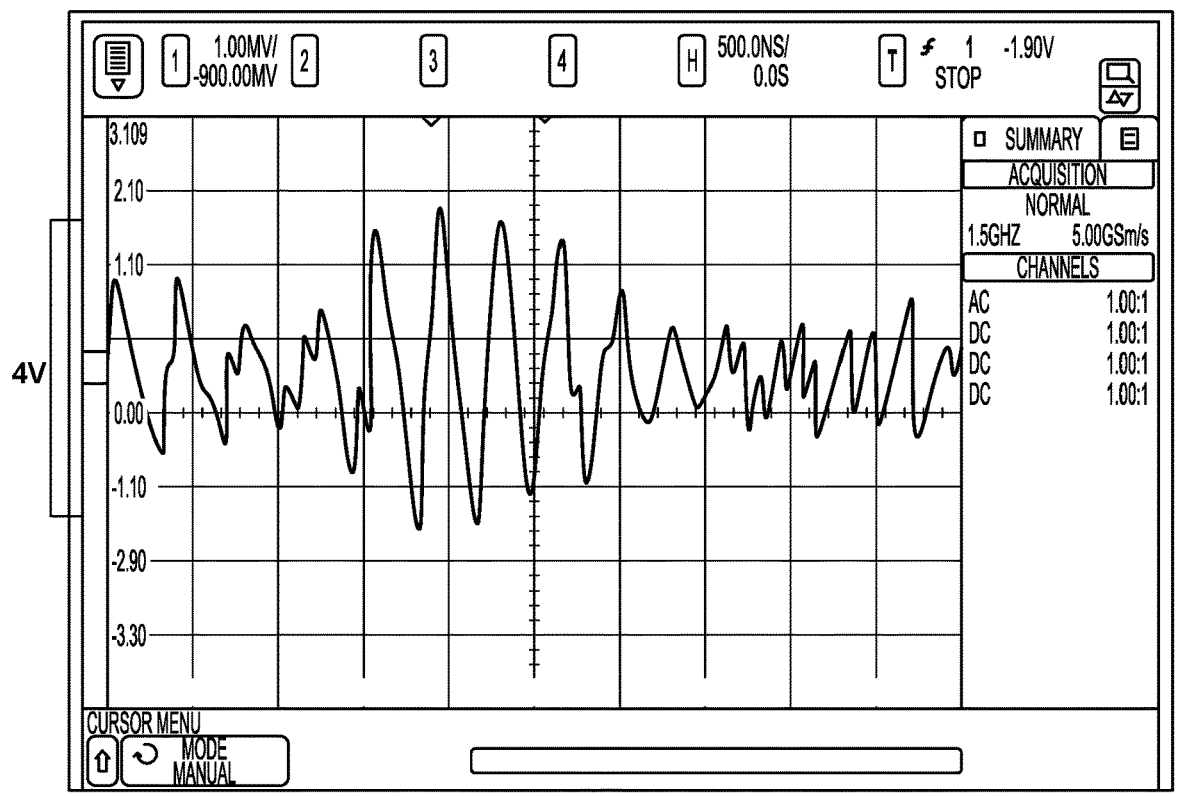
FIGS. 21A and 21B are conceptual diagrams illustrating a comparison between an example single-ended and an example differential coupling experiment, showing an example partial-discharge simulated signal and laboratory noise.
Figure 21B:
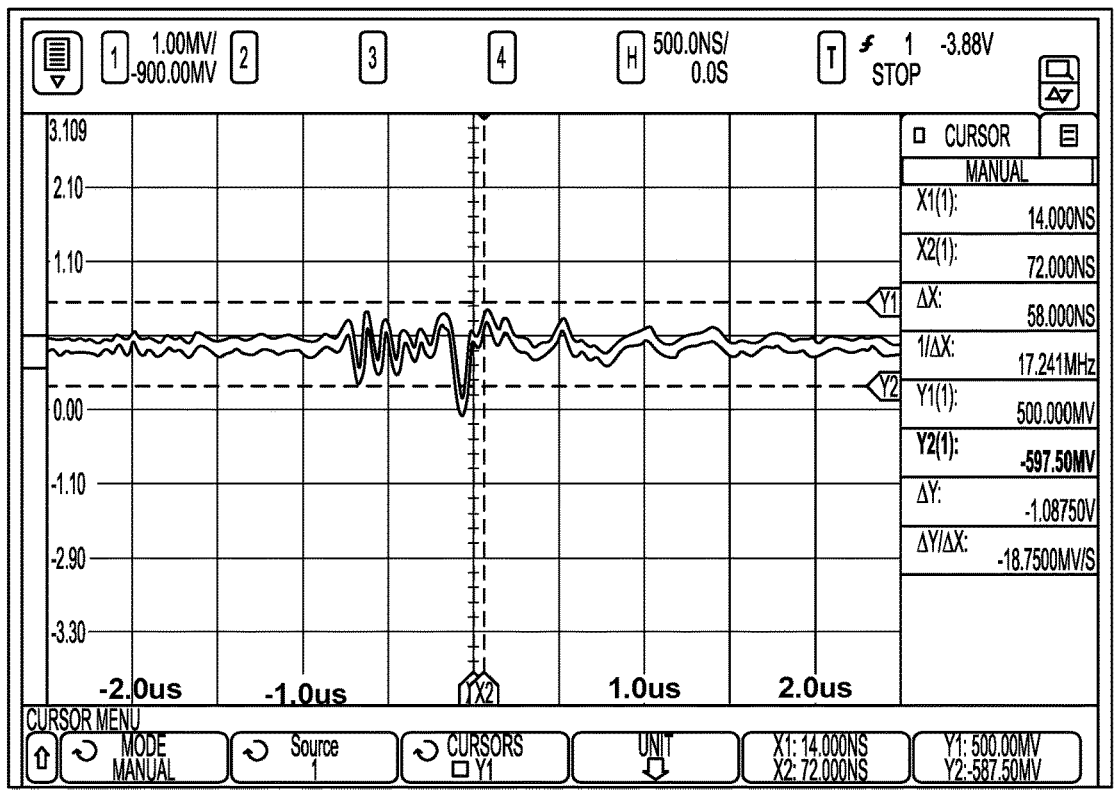

As shown in FIGS. 21A and 21B, the results (FIG. 21B) of this differential setup (FIGS. 20A and 20B) may be compared to the results (FIG. 21A) of the single-ended setup described above with respect to FIGS. 18A-19, with the same noise conditions (e.g., where a relatively high level of EM noise is present). FIG. 21A shows a signal from an example "single-ended" coupling setup (as described above with respect to FIGS. 18A 19) in a "noisy" laboratory, having an amplitude range of about 4 Volts (peak-to-peak), displayed at a scale of about 1 Volt per division. FIG. 21B shows a signal from the example "differential" coupling setup of FIGS. 20A and 20B, having a value of about 200 pC, displayed at approximately the same scale as shown in FIG. 21A (e.g., about 1 Volt per division). Further, FIG. 22 illustrates signal and noise data from the example differential-coupling experimental setup of FIGS. 20A and 20B, showing the resulting signal and noise at an amplitude range of about 0.2 Volts (peak-to-peak), displayed at a scale of about 200 Millivolts per division.

Figure 22:
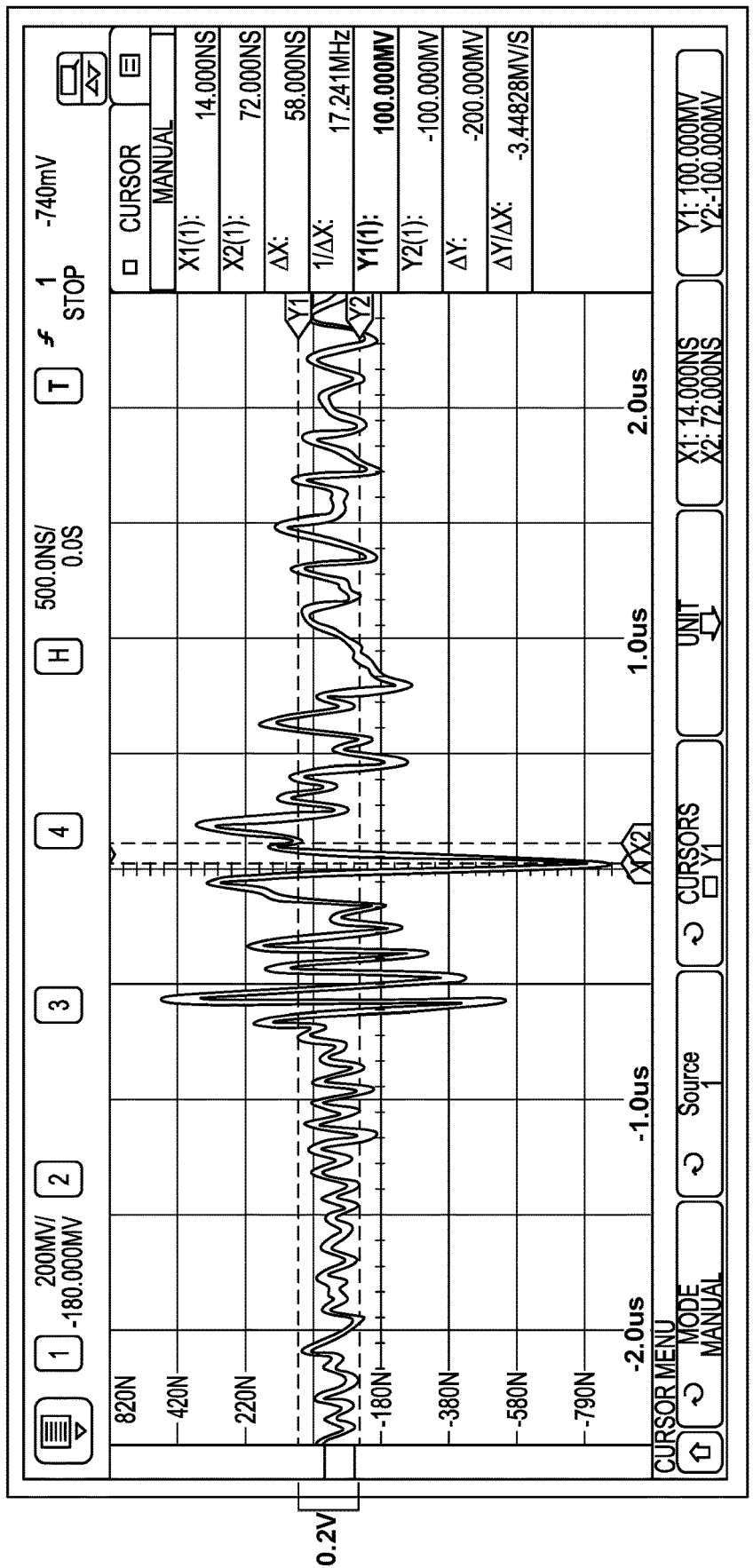
FIG. 22 is a conceptual diagram illustrating an example differential experiment showing signal and noise data.

As shown in FIG. 21A, the noise level on the single-ended setup may be relatively high, e.g., on the order of about 4 Volts (peak to peak), as compared to 0.2 Vpp of the differential case (shown in FIGS. 21B and 22). While in the differential setup a 200 pC PD signal was easily detected on an oscilloscope, the signal may be unable to be triggered and detected in the single-ended setup of FIGS. 18A-19.

Figure 23:
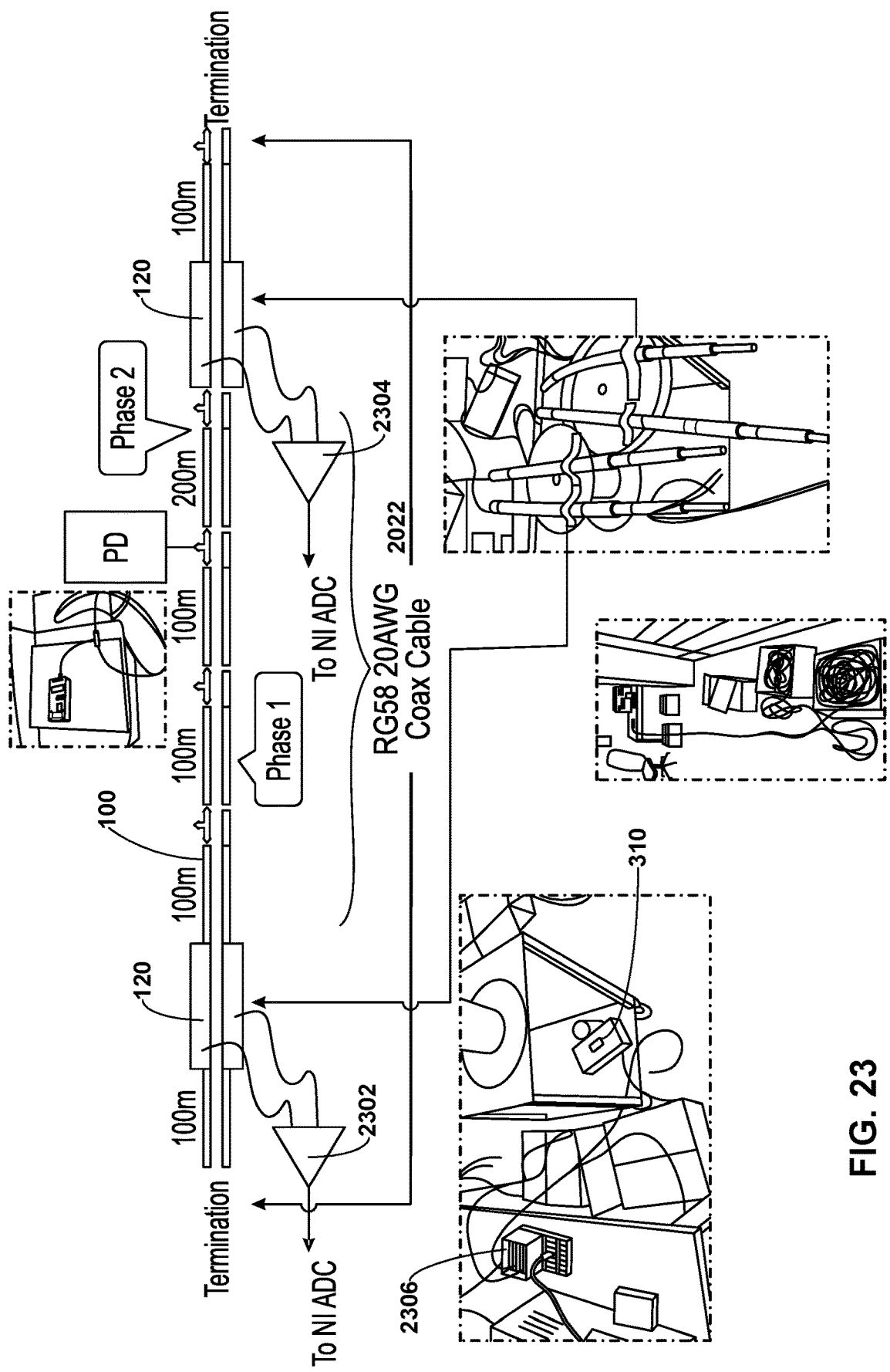
FIG. 23 is a schematic diagram illustrating an example two-node localization experiment.
Figure 24:
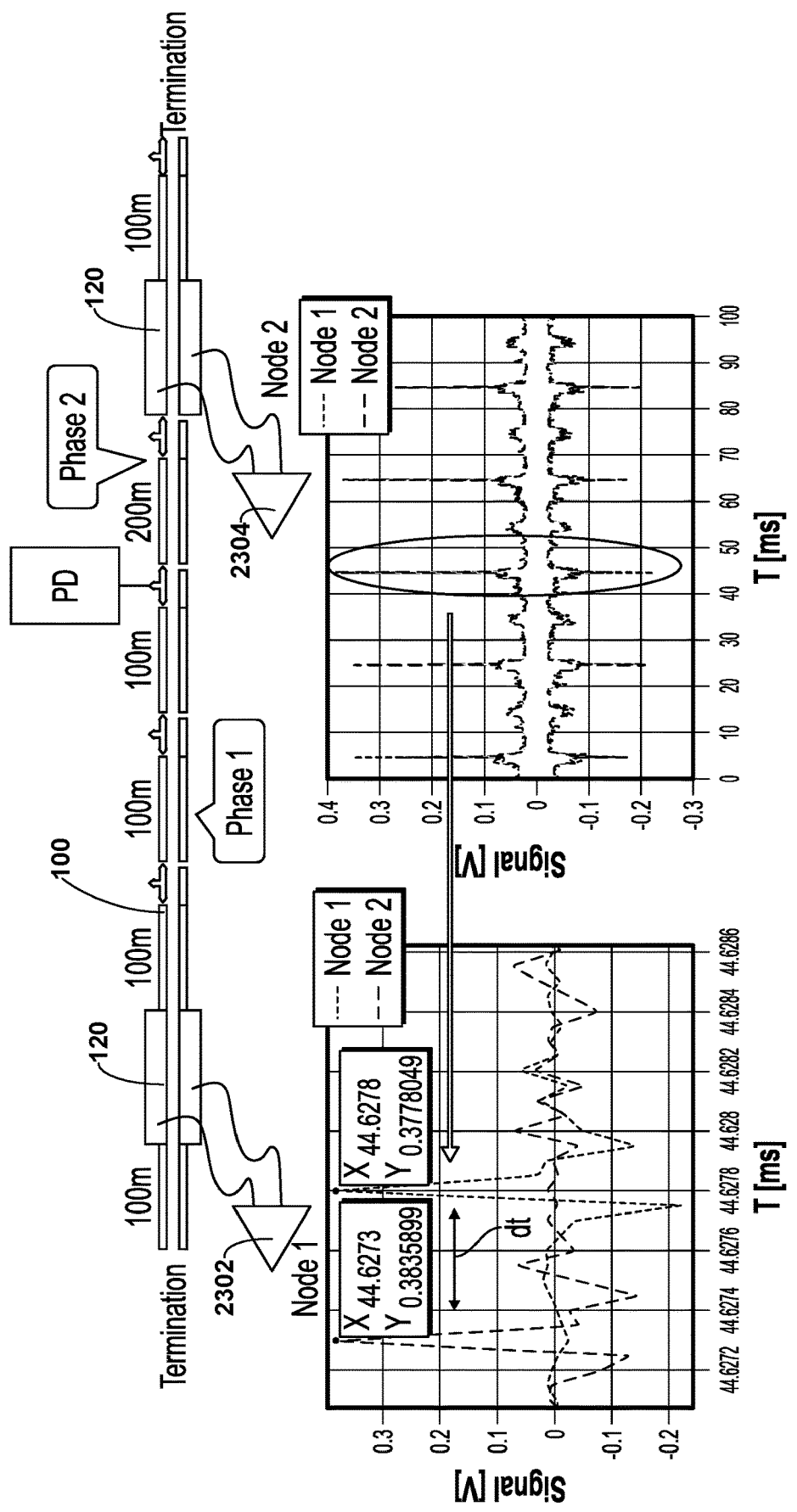
FIG. 24 is a schematic diagram illustrating results for the example two-node localization experiment of FIG. 23.

In another experiment, a two-node localization test may be conducted, as shown and described with respect to FIG. 23 (setup) and FIG. 24 (results). For instance. FIG. 23 is a schematic view of an example setup for a two-node localization experiment, including a cable 100, a coaxial cable 2022 (e.g., an RG58 20AWG coaxial cable), a current amplifier 310, two nodes 2302 and 2304 (e.g., nodes 202 of FIG. 2), and an analog-to-digital converter (ADC) 2306. In some examples, as shown in FIG. 23, the experimental setup for a two-node localization test may further include two pairs or nodes of about 3-foot MV cables 100, each one of the four MV cable pieces covered with copper foil 118 to form a conductive coupling 120, as described above. Between the MV nodes may be two parallel lines of 500-meter-long, RG58 coaxial cables 2022, segmented at 100-meter intervals with T ports. Additionally, the external side of each pair may be connected to two parallel lines of 100-meter-long RG58 coaxial cable.

Each pair may be differentially connected through an RF transformer to a current amplifier 310 having a frequency band in 0.2-10 MHz range. The output of the amplifier 310 may be sampled on two channels of a National Instruments ADC 2306, running at about 20 MS/s, and sampling consecutive samples of 100 ms long, separated by a few seconds.

FIG. 24 shows results for the example two-node localization experiment of FIG. 23. The relevant calculations for the results shown in FIG. 24 are:

$$dt=500ns$$

$$dx=300-200m=100m$$

$$dt*c=500ns*200,000km/s=100m$$

For instance, in some examples, a PD injector may be connected to one of the 500 m long coaxial cables at one of the T-ports along the cable 100 of FIG. 23. A PD signal may be injected and picked up at the two ends with MV cable pairs. A Matlab algorithm may be used to detect the peak PD signal from both channels and compared the time of arrival difference. That difference is multiplied by the stated propagation velocity of the RG58 cable to estimate the difference in length between the T port and the two nodes 2302, 2304. That difference is compared against the actual known distance. Additionally, a simple calculation can then be used to find the distance of the PD injector from each of the nodes 2302, 2304 (assuming a known distance between the nodes), as shown in FIG. 24.

In another experiment, noise field tests may be conducted, as shown and described with respect to FIGS. 25A-26C. For example, FIGS. 25A-25C illustrate three different types of voltage facilities having capacitive couplings 120, according to the techniques described above. The signal and noise may be analyzed at each of these various types of locations, and transmission and coupling may be performed. For instance, FIG. 25A shows an example office building having three 22 kV electrical cables 2502A-2502C, each having from about 8 Amps to about 30 Amps per phase. FIG. 25B shows an example of a residential distribution having three 22 kV electrical cables 2504A-25040, each having about 40 A per phase. FIG. 25C shows an example industrial plant having a plurality of 22 kV electrical cables 2506, each having about 200 A/phase.

The field tests may be conducted at the example office building of FIG. 25A, the residential site of FIG. 25B, and the industrial plant of FIG. 25C, to evaluate the noise picked up by the differential capacitive sensor 120 in situ. The experimental setup for the noise field tests may include two separated copper foil capacitors 120 that were applied on each phase of a 3-phase cable system (single-phase MV cables). Three different channels may be connected differentially to three identical channels of a current amplifier 310 (with a 1:1 RF transformer front end) and captured simultaneously by three channels of the above DAC 2306 (running at 20 MS/s, and sampling consecutive samples of 100 ms long, separated by a few seconds). Three Rogowski coils may be placed over the cable phases and captured simultaneously with the differential channels to measure the 50 Hz grid current (at a sample rate of about 50 kS/s).

Figures 26A, 26B, 26C:
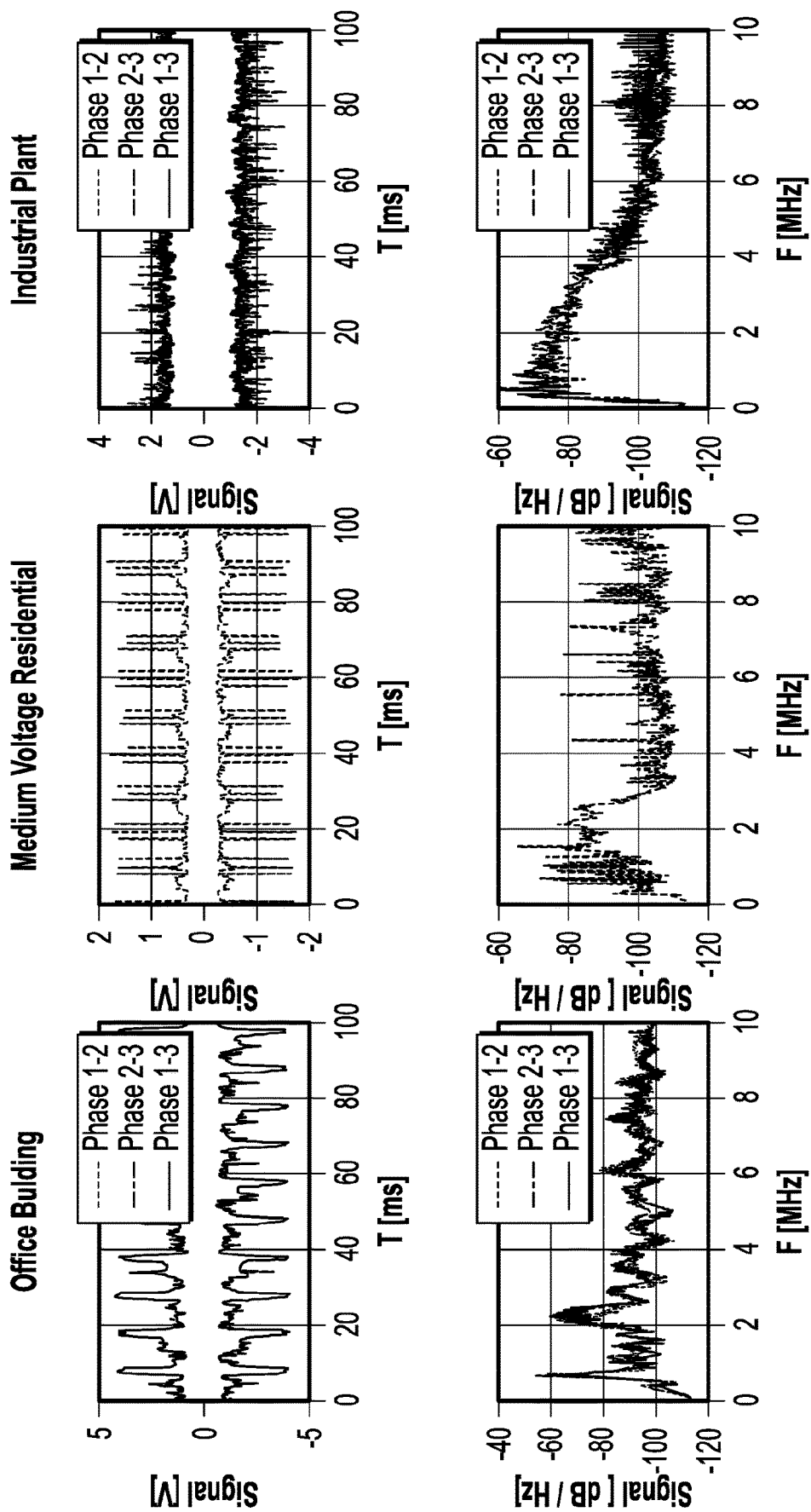
FIGS. 26A-26C are graphs illustrating results for capacitive couplings at respective example voltage facilities illustrated in FIGS. 25A-25C.

FIGS. 26A-26C show example results for experimental capacitive couplings at the various example voltage facilities of FIGS. 25A-25C, respectively. The capacitive couplings 120 may be used to collect time-domain signals and estimate the power spectrum. As shown in FIGS. 26A-26C, the observed dominant noise may be broadband, ranging from a few hundred kHz and up to about 3-4 MHz. The noise characteristics may vary from site-to-site and from time-to-time. The noise may have an internal repeating pattern with a 50 Hz and a 100 Hz cycle. Some sites may show narrow-band noise sources (e.g., peaks in the noise-power spectrum), modulated by a lower-frequency component (of about a few tens of kHz).

Figure 27B:
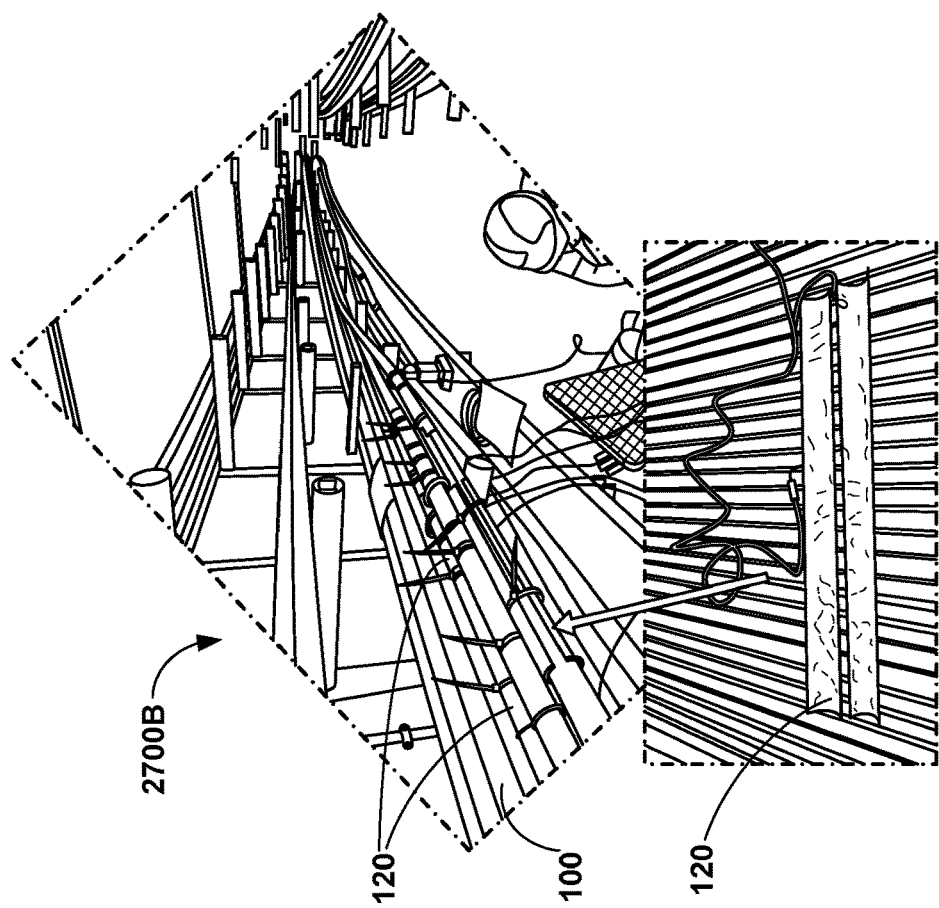
FIGS. 27A and 27B are conceptual diagrams illustrating example send-and-receive couplings at an example industrial facility.
Figure 27A:
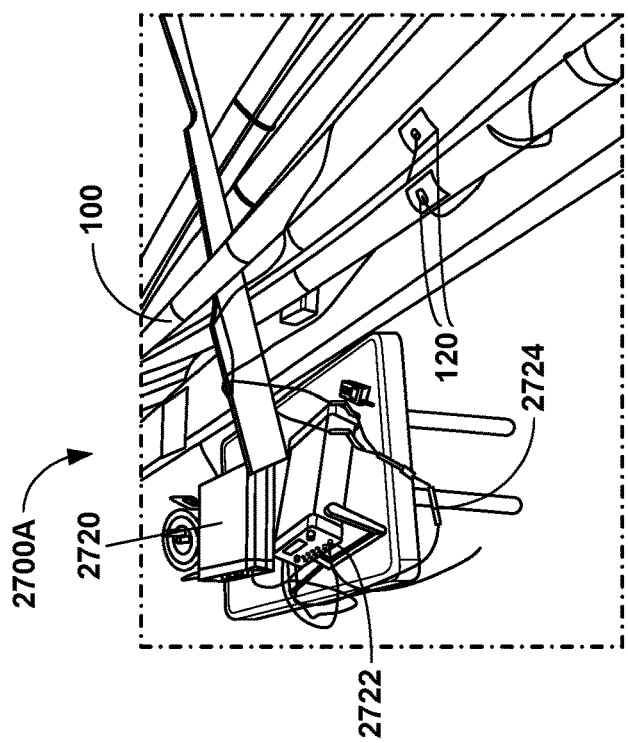
Figure 28:
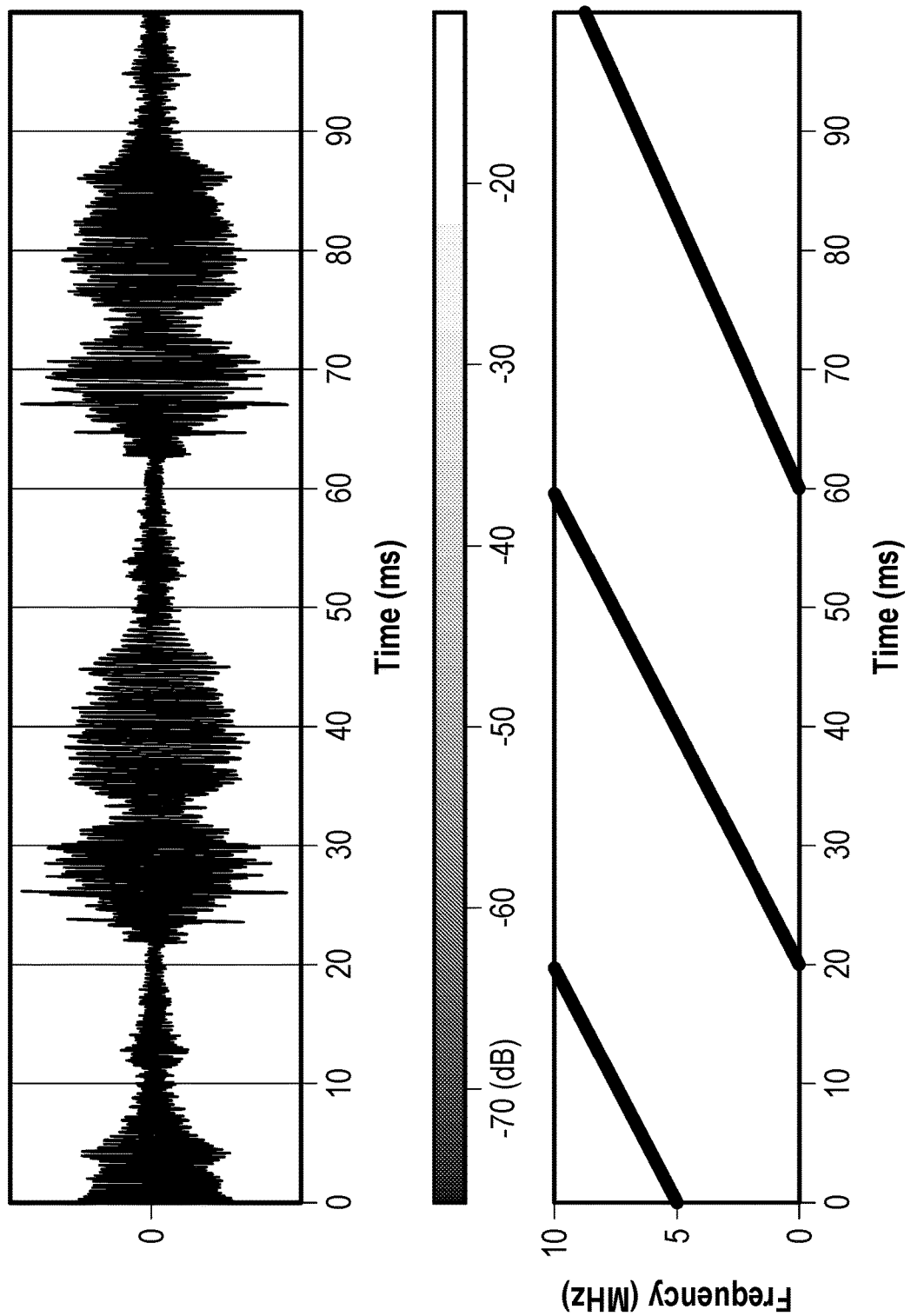
FIG. 28 are graphs illustrating results obtained for the example receive coupling at the industrial facility of FIGS. 27A and 27B.

In another field-test experiment, intentional signal injection and frequency-dependent attenuation may be tested, as shown and described with respect to FIGS. 27A-32B. For example, FIGS. 27A and 27B show example send-and-receive (conductive) couplings 120 at an example industrial facility, where a "chirp" signal (shown in FIG. 28) may be introduced and measured differentially. For instance, FIG. 27A depicts a "sending station" or "transmission (Tx) post" 2700A, having a plurality of capacitive differential couplers 120 attached to electrical cables 100. Sending station 2700 includes a nano second (NS) pulse generator 2720, a "chirp" signal generator 2722, an RF transformer 2724, and capacitive couplings 120 on cables 100. Similarly, FIG. 27B shows a "receiving station" or "receiving (Rx) post" 2700B, including capacitive differential couplers at various distances along cables 100. The industrial plant site shown in FIGS. 27A and 27B may include an MV cable system exposed along a length of about 182 m. At one end of the cable system (e.g., at Tx post 2700A), copper foils 118 may be placed over two MV cables 100 and connected via a 1:1 RF transformer 2724 to a signal generator 2722 generating linear frequency modulation (LFM) chirp signals (as shown in FIG. 28). Example types of chirp signals that may be used include: Type A (level of 0.4 Volts peak-to-peak (Vpp), range 1-10 MHz); Type B (level of 4 or 5 Vpp, range 1-10 MHz); and Type C (Level of 5 and 10 Vpp, range of 8-50 MHz). In yet another experiment, NS pulse generator 2720 may be connected to the MV cables 100 with a similar setup. Levels of approximately 0.4 Vpp and 1.2 Vpp, measured differentially on the copper foil 118, may be used.

At several locations away from Tx post 2700A (FIG. 27A), Rx post 2700B (FIG. 27B) may be set up by placing three copper foil pairs 118 over three cables 100, two of which may include the same cables 100 that Tx post 2700A is connected to.

FIG. 28 shows example experimental results that may be obtained at Rx post 2700B of FIG. 27B. For example, at the industrial site, a 1-10 MHz LFM chirp may be introduced at the sending site 2700A (FIG. 27A) and recorded at receiving site 2700B (FIG. 27B) located at about 20 meters, 80 meters, 100 meters, and/or 182 meters away from the sending site 2700A. The plot shown in FIG. 28 is an example of the time domain (top) and the frequency content (bottom) at the Rx post 2700B located 182 meters from the sending site 2700A.

Four different experimental setups may be performed; (1) with three channels of the current amplifier sampled by the DAC, linked with type "A" chirps; (2) RF transformer 2724 connected to the two Tx post cables 100, sampled by the DAC, linked with type "B" and type "C" chirps; (3) RF transformer 2724 connected to the two Tx post cables 100, sampled by a portable oscilloscope connected with a computer and sampling at 200 MS/s, linked with type "C" chirps; and/or (4) three channels of the current amplifier sampled by the DAC, linked with the nano-second pulse injection.

Setup (1) may be used to demonstrate the ease of injecting and receiving intentional signals via the capacitive differential coupling 120. Sets (2) and (3) may be used to evaluate (by post-processing) the frequency-dependent attenuation of the chirp signals. First, the LFM signal's power spectral density at each measurement location 2700B (off ranges from the Tx) may be estimated.

Figure 29:
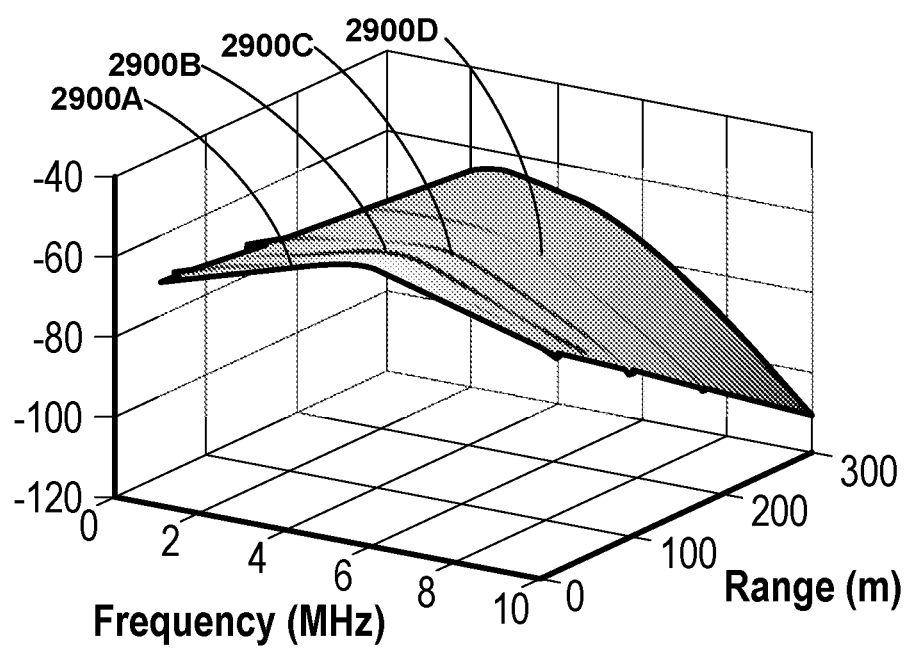
FIG. 29 is a plot illustrating an example experimental interpolation for received power density.

As shown in FIG. 29, the interpolation of data from Rx post 2700B may be used to estimate the power spectral density at any off-range in between. For example, FIG. 29 is a plot of an example experimental interpolation for received power-density measurements from Rx station 2700B of FIG. 27B. Black lines 2900A-2900D represent LFM spectra measured at 20 meters, at 28 meters, at 100 meters, and at 182 meters, respectively. Interpolation between the curves 2900A-2900D may be used to obtain the 2-D surface shown in FIG. 29.

Figure 30:
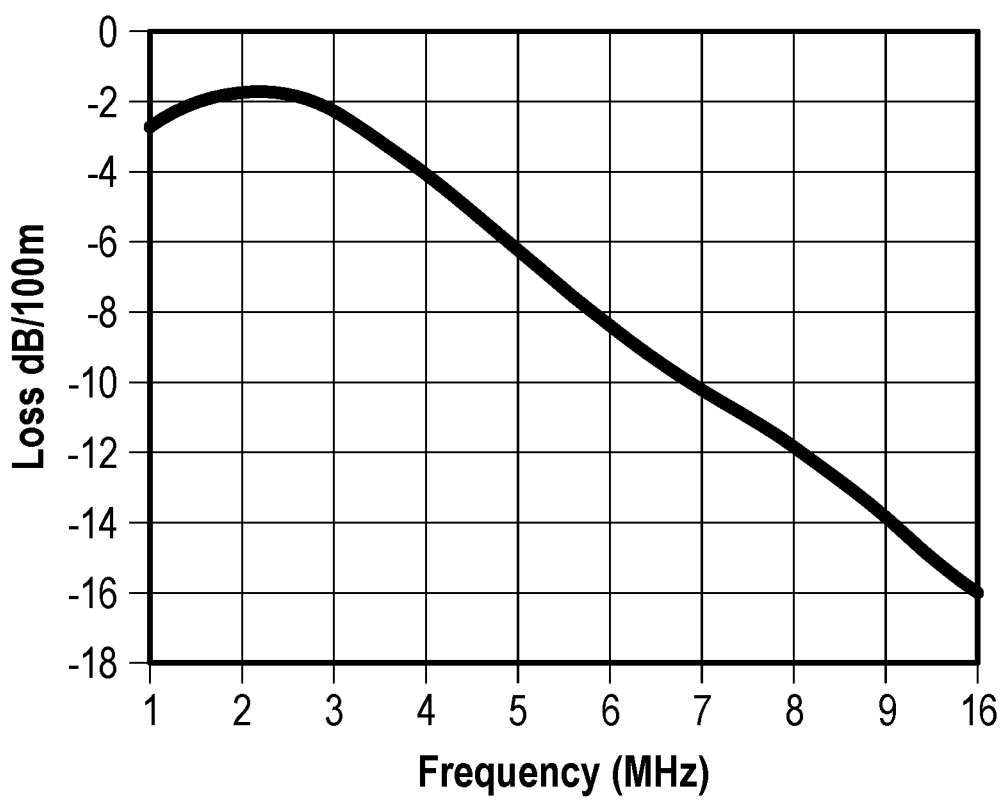
FIG. 30 is a plot illustrating loss data for a frequency band for the experiment shown in FIG. 29.

Finally, as shown in FIG. 30, the gradient of the surface along each frequency bin may be used to estimate the frequency-dependent loss. For example, FIG. 30 is a line graph showing example loss data for a frequency band for the experimental setups shown in FIGS. 27A and 27B. More specifically, FIG. 30 depicts results of analysis on the obtained data for the 1-10 MHz frequency band shown in FIG. 29, and illustrates the estimated frequency-dependent loss (in dB) per 100 meters of electrical cable 100. The chirp signals recorded at the different distances may be used for post-analysis in which the frequency-dependent attenuation coefficient may be estimated (e.g., provided in units of dB per unit length for each frequency bin).

Figure 31:
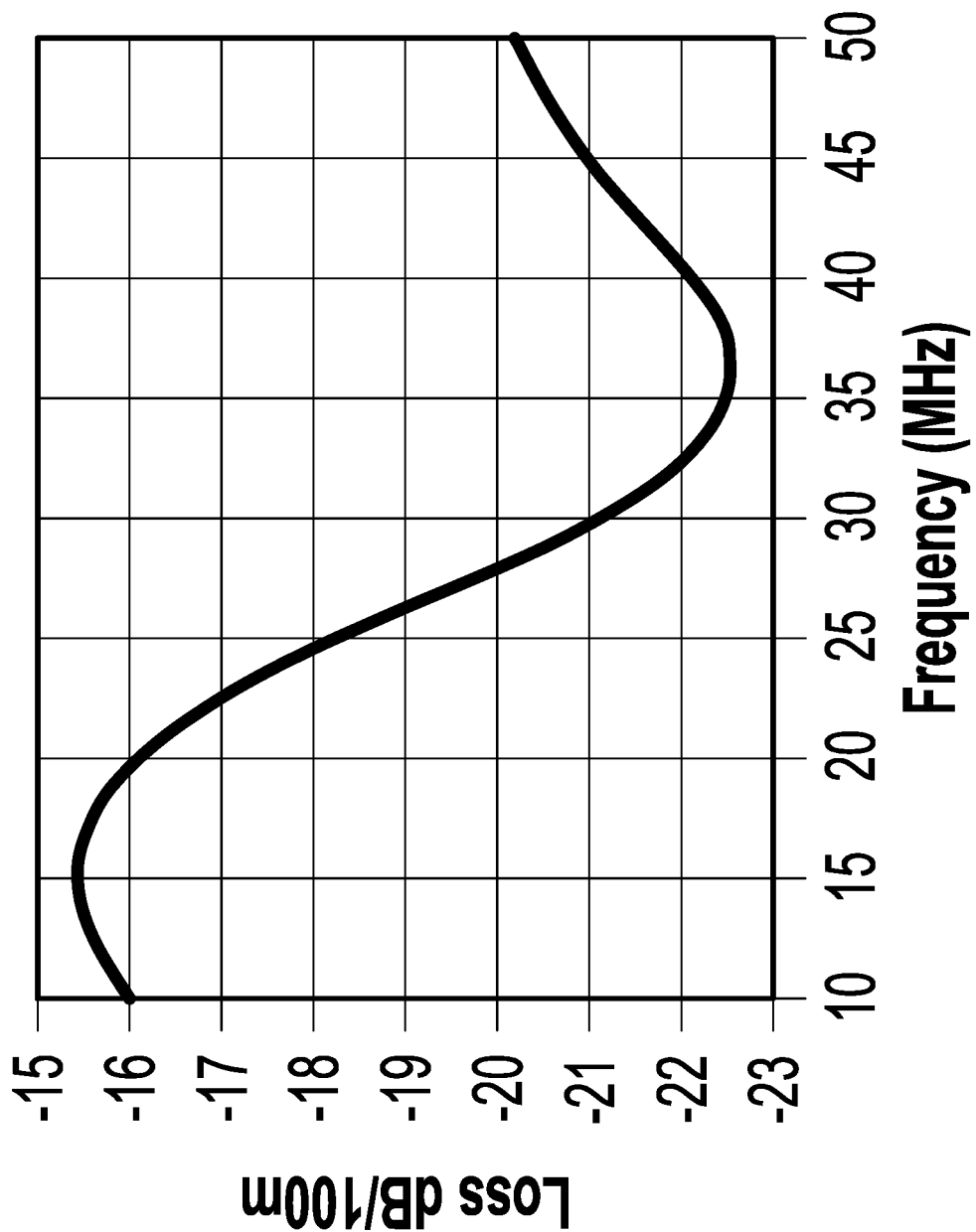
FIG. 31 is a plot illustrating loss data for a different frequency band for the experiment shown in FIG. 29.

As shown in FIG. 31, a similar analysis may be used to obtain the frequency-dependent loss for the frequency range in setup (3). For example, FIG. 31 is a plot showing loss data for a different frequency band for the experimental setup shown in FIGS. 27A and 27B. More specifically, FIG. 30 depicts results of analysis on the obtained data for the 8-50 MHz band shown in FIG. 29, and illustrates the estimated frequency-dependent loss (in dB) per 100 meters of electrical cable 100.

For experimental setups (1)-(3), where a chirp signal is sent (e.g., transmitted) from Tx post 2700A, the following results can be summarized. Chirp signals may be readily injected and received via a differential capacitive coupling 120. A transmitted level of about 0.4 V, which could be easily achieved by low power and basic electronic circuits, may be readily detected by the capacitively coupled differential current amplifier at Rx post 2700B, located at about 182 m away from Tx post 2700A. The chirp signal may be detected, at a certain level, via the differential pair coupled to the same cable pair 100 shared by the transmitter side 2700A, but additionally, the chirp signal may be detected via the other differential pairs which share only one of the cables with the transmitter side, at half the voltage level (e.g., at −6 dB).

Experimental setup (4) may be used to demonstrate a detection of said pulses by a differential capacitive sensor 120 and current amplifier in situ (e.g., wherein detection is performed in post-processing of recorded signals). For instance, analysis of data from experimental setup (4) demonstrates that, at a certain pulse level, chirp-signal detection at a real-world industrial plant environment, via the techniques of this disclosure, is achievable. Additionally, as shown in FIGS. 32A and 32B, basic high-pass filtering enables the detection of a signal having a power level of about −10 dB below the original signal. For example, FIGS. 32A and 32B show measurement results for different repeating pulse levels at an example industrial site (e.g., as depicted in FIGS. 27A and 27B). For instance, a repeating pulse at levels of 1.2 volts and 0.4 volts may be injected differentially through the coupling capacitors 120 at Tx post 2700A in the industrial site, and measured at Rx post 2700B located about 182 meters away. FIG. 32A depicts an example measured signal for the 1.2 V case, and FIG. 32B depicts an example measured signal for the 0.4 V case. Central region 3200 of FIG. 32B represents the same measured signal after high-pass filtering at about 6 MHz, which reveals the injected signals from the background noise.

In the present detailed description of the preferred embodiments, reference is made to the accompanying drawings, which illustrate specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "proximate." "distal," "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above or on top of those other elements.

The techniques of this disclosure may be implemented in a wide variety of computer devices, such as servers, laptop computers, desktop computers, notebook computers, tablet computers, hand-held computers, smart phones, and the like. Any components, modules or units have been described to emphasize functional aspects and do not necessarily require realization by different hardware units. The techniques described herein may also be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset. Additionally, although a number of distinct modules have been described throughout this description, many of which perform unique functions, all the functions of all of the modules may be combined into a single module, or even split into further additional modules. The modules described herein are only exemplary and have been described as such for better ease of understanding.

If implemented in software, the techniques may be realized at least in part by a computer-readable medium comprising instructions that, when executed in a processor, performs one or more of the methods described above. The computer-readable medium may comprise a tangible computer-readable storage medium and may form part of a computer program product, which may include packaging materials. The computer-readable storage medium may comprise random access memory (RAM) such as synchronous dynamic random access memory (SDRAM), read-only memory (ROM), non volatile random access memory (NVRAM), electrically erasable programmable read-only memory (EEPROM), FLASH memory, magnetic or optical data storage media, and the like. The computer-readable storage medium may also comprise a non-volatile storage device, such as a hard-disk, magnetic tape, a compact disk (CD), digital versatile disk (DVD), Blu-ray disk, holographic data storage media, or other non-volatile storage device.

The term "processor," as used herein may refer to any of the foregoing structure or any other structure suitable for implementation of the techniques described herein. In addition, in some aspects, the functionality described herein may be provided within dedicated software modules or hardware modules configured for performing the techniques of this disclosure. Even if implemented in software, the techniques may use hardware such as a processor to execute the software, and a memory to store the software. In any such cases, the computers described herein may define a specific machine that is capable of executing the specific functions described herein. Also, the techniques could be fully implemented in one or more circuits or logic elements, which could also be considered a processor.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor", as used may refer to any of the foregoing structure or any other structure suitable for implementation of the techniques described. In addition, in some aspects, the functionality described may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

It is to be recognized that depending on the example, certain acts or events of any of the methods described herein can be performed in a different sequence, may be added, merged, or left out altogether (e.g., not all described acts or events are necessary for the practice of the method). Moreover, in certain examples, acts or events may be performed concurrently, e.g., through multi-threaded processing, interrupt processing, or multiple processors, rather than sequentially.

In some examples, a computer-readable storage medium includes a non-transitory medium. The term "non-transitory" indicates, in some examples, that the storage medium is not embodied in a carrier wave or a propagated signal. In certain examples, a non-transitory storage medium stores data that can, over time, change (e.g., in RAM or cache).

Various examples have been described. These and other examples are within the scope of the following claims.

What is claimed is:

1. A monitoring system comprising a node configured to couple to a multiphase electric power line comprising a plurality of cables, the plurality of cables comprising a first cable carrying a first phase and a second cable carrying a second phase, each cable comprising a central conductor, a shield layer, and a jacket layer concentrically surrounding the shield layer, wherein the node comprises:
   a first coupling layer disposed over the jacket layer of the first cable and capacitively coupled to the shield layer of the first cable; and
   a second coupling layer disposed over the jacket layer of the second cable and capacitively coupled to the shield layer of the second cable;

wherein the node is differentially coupled to the first and second cables to generate a differential data signal, and wherein the node is configured to use the first or second coupling layer to perform at least one of:
sensing a native signal within the first or second cable;
injecting an intentional signal into the first or second cable;
receiving an intentional signal from within the first or second cable; or
providing a channel characterization of the first or second cable.

2. The system of claim 1, wherein the first and second cables are parts of the same multiphase cable of the plurality of cables.

3. The system of claim 1, wherein the first and second cables are different cables of the plurality of cables.

4. The system of claim 1, wherein the multiphase power line comprises a three-phase power line, and wherein the first and second phases are different phases of the three-phase power line.

5. The system of claim 1, wherein the shield layer of the first cable comprises a ground conductive layer.

6. The system of claim 1, wherein the system is configured to use the first or second capacitive coupling to communicate the differential data signal along the power line.

7. The system of claim 1, further comprising a communication unit electrically coupled to the shield layer of the first cable and configured to output data indicative of the health of the system via power-line communications.

8. The system of claim 1, further comprising at least one of:
a temperature sensor,
a current sensor,
a voltage sensor, or
a partial discharge sensor.

9. The system of claim 1, further comprising a power-harvesting circuit electrically coupled to the shield layer of at least one of the cables and configured to harvest electrical power from the respective cable.

10. The system of claim 1, wherein the first coupling layer generates sensor data indicative of a health of the first cable.

11. The system of claim 1, further comprising:
at least one processor; and
memory comprising instructions that, when executed by the at least one processor, cause the at least one processor to determine, based at least in part on sensor data from the first or second coupling layer, a health of an electrical-grid component.

12. The system of claim 11,
wherein the electrical-grid component comprises a cable accessory; and
wherein execution of the instructions cause the at least one processor to determine the health of the cable accessory by at least causing the at least one processor to predict, based at least in part on the sensor data, whether the cable accessory will fail within a predetermined amount of time.

13. The system of claim 1,
wherein an RF voltage is applied between the first coupling layer and a ground; or
wherein an RF voltage is applied differentially between a cable pair of the power line.

14. The system of claim 1, wherein the injected signal is received by at least one of the first and second coupling layers.

15. The system of claim 1, wherein the system is configured to inject and receive the intentional signal for at least one of:
communication between nodes of the system;
time synchronization between the nodes;
time-domain reflectometry (TDR) or frequency-domain reflectometry (FDR) to detect and localize defects, faults, or structural changes in the power line;
channel characterization; or grid-configuration mapping.

16. The system of claim 1, further comprising a capacitive coupling device comprising the first coupling layer of the node, the jacket layer of the first cable, and the shield layer of the first cable.

17. The system of claim 1, wherein the node is configured to provide differential noise rejection for receiving the intentional signal and the native signal on the first or second cables.

18. The system of claim 1, wherein the system detects partial discharge within the power line.

19. The system of claim 1, wherein the node comprises a first node configured to inject the intentional signal, and wherein the system further comprises a second node configured to detect the intentional signal.

20. The system of claim 1, further comprising a plurality of nodes, wherein the plurality of nodes is utilized to discriminate which cable of the power line contains a signal of interest.

* * * * *